(12) United States Patent  (10) Patent No.: US 9,635,294 B2
Mabuchi  (45) Date of Patent: Apr. 25, 2017

(54) SOLID-STATE IMAGING DEVICE, PRODUCTION METHOD OF THE SAME, AND IMAGING APPARATUS

(71) Applicant: Sony Corporation, Tokyo (JP)

(72) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/272,234

(22) Filed: Sep. 21, 2016

(65) Prior Publication Data

US 2017/0013223 A1  Jan. 12, 2017

Related U.S. Application Data

(60) Continuation of application No. 14/453,298, filed on Aug. 6, 2014, now Pat. No. 9,455,296, which is a
(Continued)

(30) Foreign Application Priority Data

May 24, 2007  (JP) .................................. 2007-138081

(51) Int. Cl.
*H04N 5/335* (2011.01)
*H04N 5/3745* (2011.01)
(Continued)

(52) U.S. Cl.
CPC ..... *H04N 5/37457* (2013.01); *H01L 27/1461* (2013.01); *H01L 27/1463* (2013.01);
(Continued)

(58) Field of Classification Search
None
See application file for complete search history.

(56) References Cited

U.S. PATENT DOCUMENTS 4,809,075 A  2/1989  Akimoto et al.
7,294,873 B2  11/2007  Suzuki et al.
(Continued)

FOREIGN PATENT DOCUMENTS

JP  63-100879  5/1988
JP  2003-031785 A  1/2003
(Continued)

OTHER PUBLICATIONS

Japanese Office Action issued on Jun. 19, 2012 in connection with counterpart JP Application No. 2007-138081.
(Continued)

*Primary Examiner* — Stephen Coleman
(74) *Attorney, Agent, or Firm* — Wolf, Greenfield & Sacks, P.C.

(57) ABSTRACT

A solid-state imaging device in which a pixel circuit formed on the first surface side of a semiconductor substrate is shared by a plurality of light reception regions and second surface side of the semiconductor substrate is the light incident side of the light reception regions. The second surface side regions of the light reception regions are arranged at approximately even intervals and the first surface side regions of the light reception regions e are arranged at uneven intervals. Respective second surface side regions and first surface side regions are joined in the semiconductor substrate so that the light reception regions extend from the second surface side to the first surface side of the semiconductor substrate.

76 Claims, 16 Drawing Sheets

Related U.S. Application Data continuation of application No. 14/257,644, filed on Apr. 21, 2014, now Pat. No. 9,281,337, which is a continuation of application No. 13/928,915, filed on Jun. 27, 2013, now Pat. No. 8,749,008, which is a continuation of application No. 13/438,425, filed on Apr. 3, 2012, now Pat. No. 8,497,561, which is a continuation of application No. 12/852,747, filed on Aug. 9, 2010, now Pat. No. 8,173,479, which is a division of application No. 12/124,496, filed on May 21, 2008, now Pat. No. 7,884,436.

(51) Int. Cl.
*H01L 27/146* (2006.01)
*H04N 5/357* (2011.01)
*H04N 9/04* (2006.01)

(52) U.S. Cl.
CPC .... *H01L 27/1464* (2013.01); *H01L 27/14621* (2013.01); *H01L 27/14627* (2013.01); *H01L 27/14636* (2013.01); *H01L 27/14641* (2013.01); *H01L 27/14645* (2013.01); *H01L 27/14689* (2013.01); *H04N 5/3575* (2013.01); *H04N 5/37455* (2013.01); *H04N 9/045* (2013.01)

(56) References Cited

U.S. PATENT DOCUMENTS

| | | | |
|---|---|---|---|
| 7,468,289 B2 | 12/2008 | Maruyama et al. |
| 7,593,049 B2 | 9/2009 | Sekine |
| 7,638,804 B2 | 12/2009 | Kido et al. |
| 7,812,874 B2 | 10/2010 | Iwabuchi et al. |
| 7,884,436 B2 | 2/2011 | Mabuchi |
| 7,947,528 B2 | 5/2011 | Iwabuchi et al. |
| 8,173,479 B2 | 5/2012 | Mabuchi |
| 8,445,944 B2 | 5/2013 | Ezaki et al. |
| 8,497,561 B2 | 7/2013 | Mabuchi |
| 8,508,639 B2 | 8/2013 | Mabuchi et al. |
| 8,749,008 B2 | 6/2014 | Mabuchi |
| 8,896,036 B2 | 11/2014 | Mabuchi |
| 9,281,337 B2 | 3/2016 | Mabuchi |
| 9,455,296 B2 | 9/2016 | Mabuchi |
| 2002/0058353 A1 | 5/2002 | Merrill |
| 2004/0017492 A1 | 1/2004 | Stavely |
| 2004/0109075 A1 | 6/2004 | Tsunai |
| 2005/0087829 A1 | 4/2005 | Merrill et al. |
| 2005/0110885 A1 | 5/2005 | Altice, Jr. et al. |
| 2005/0237402 A1 | 10/2005 | Sase et al. |
| 2005/0282335 A1 | 12/2005 | Okonogi et al. |
| 2006/0131480 A1 | 6/2006 | Charbon et al. |
| 2006/0205107 A1 | 9/2006 | Inaba et al. |
| 2007/0091190 A1 | 4/2007 | Iwabuchi et al. |
| 2009/0189234 A1 | 7/2009 | Mabuchi |
| 2009/0231440 A1 | 9/2009 | Lai et al. |
| 2009/0261440 A1 | 10/2009 | Kawasaki |
| 2010/0123069 A1 | 5/2010 | Mao et al. |
| 2010/0297805 A1 | 11/2010 | Mabuchi |
| 2012/0187518 A1 | 7/2012 | Mabuchi |
| 2013/0320473 A1 | 12/2013 | Mabuchi |
| 2014/0225210 A1 | 8/2014 | Mabuchi |
| 2014/0312444 A1 | 10/2014 | Mabuchi |
| 2014/0347539 A1 | 11/2014 | Mabuchi |

FOREIGN PATENT DOCUMENTS

| | | | |
|---|---|---|---|
| JP | 2003-078125 A | 3/2003 |
| JP | 2004-128193 A | 4/2004 |
| JP | 2005-142221 A | 6/2005 |
| JP | 2006-049361 A | 2/2006 |
| JP | 2006-245499 A | 9/2006 |
| JP | 2006-261372 A | 9/2006 |
| JP | 2007-115994 A | 5/2007 |
| JP | 5282797 B2 | 6/2013 |

OTHER PUBLICATIONS

Korean Office Action dated Aug. 19, 2014 in connection with Application No. 10-2008-0048104.
Korean Office Action dated Aug. 19, 2014 in connection with Application No. 10-2014-0051691.

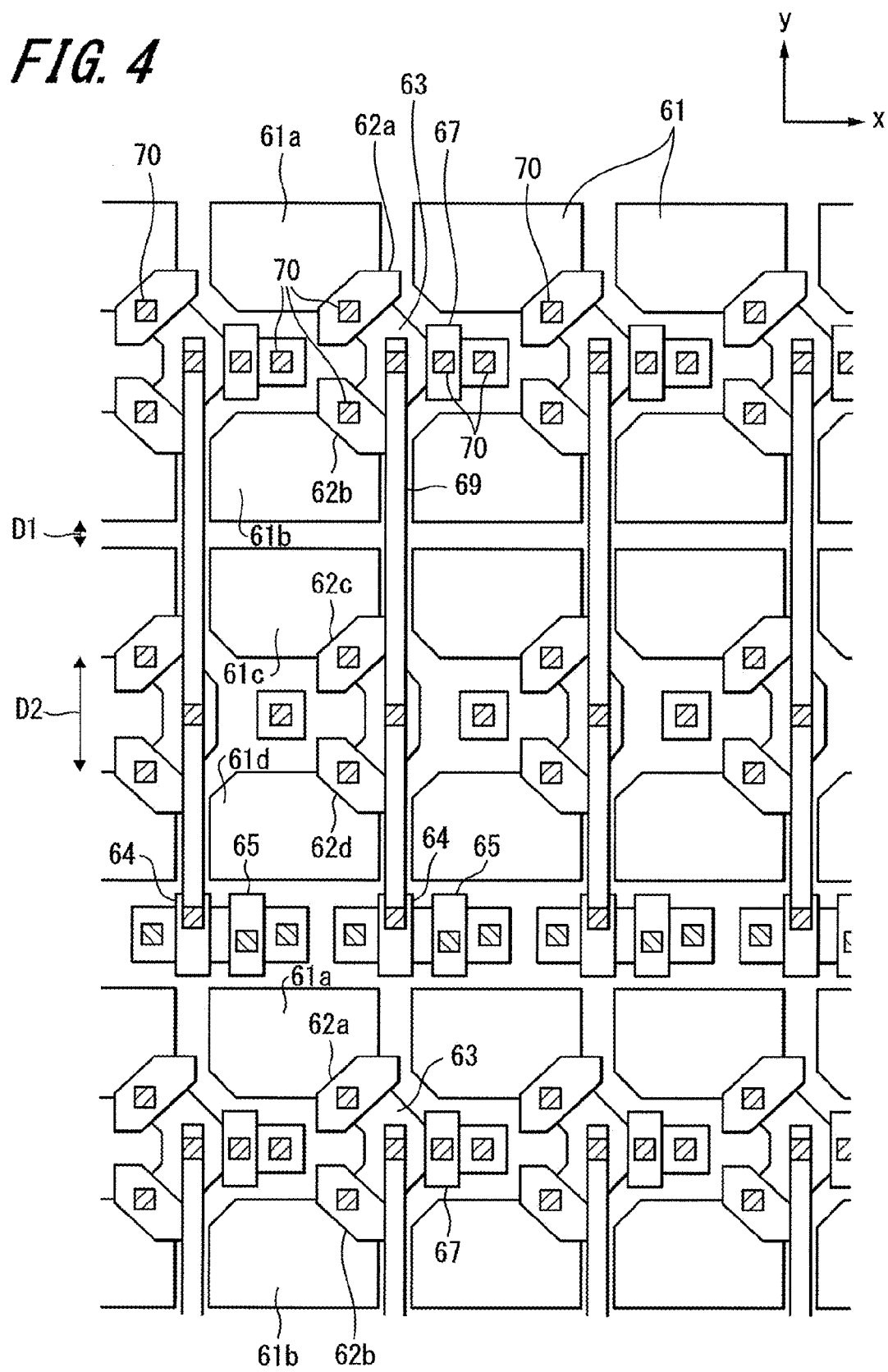

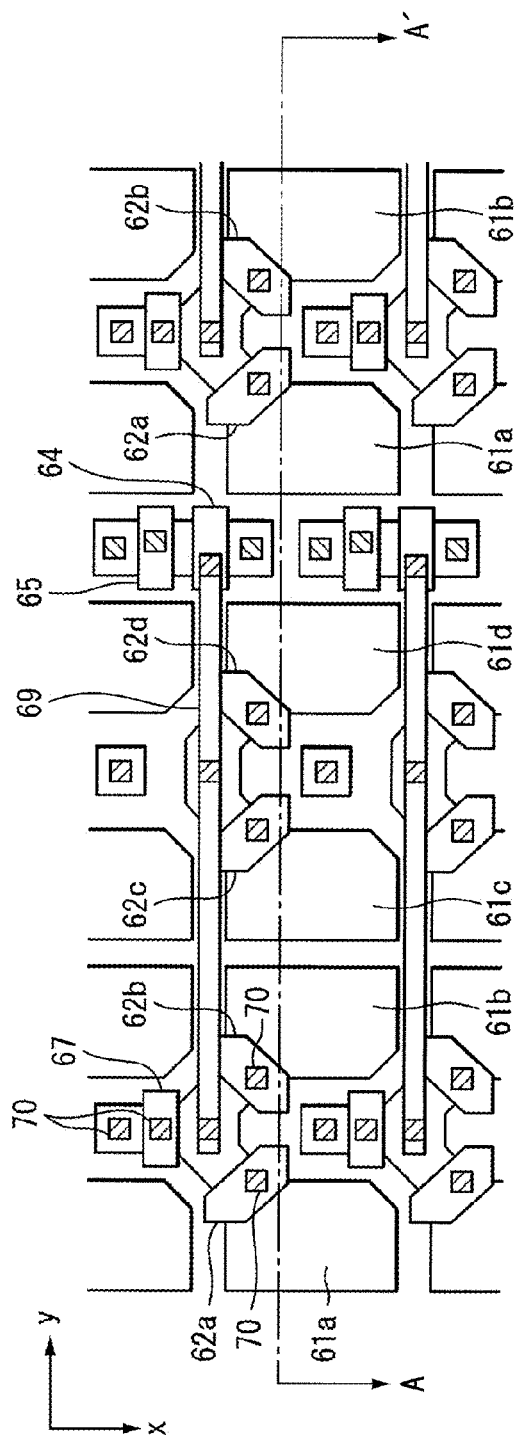
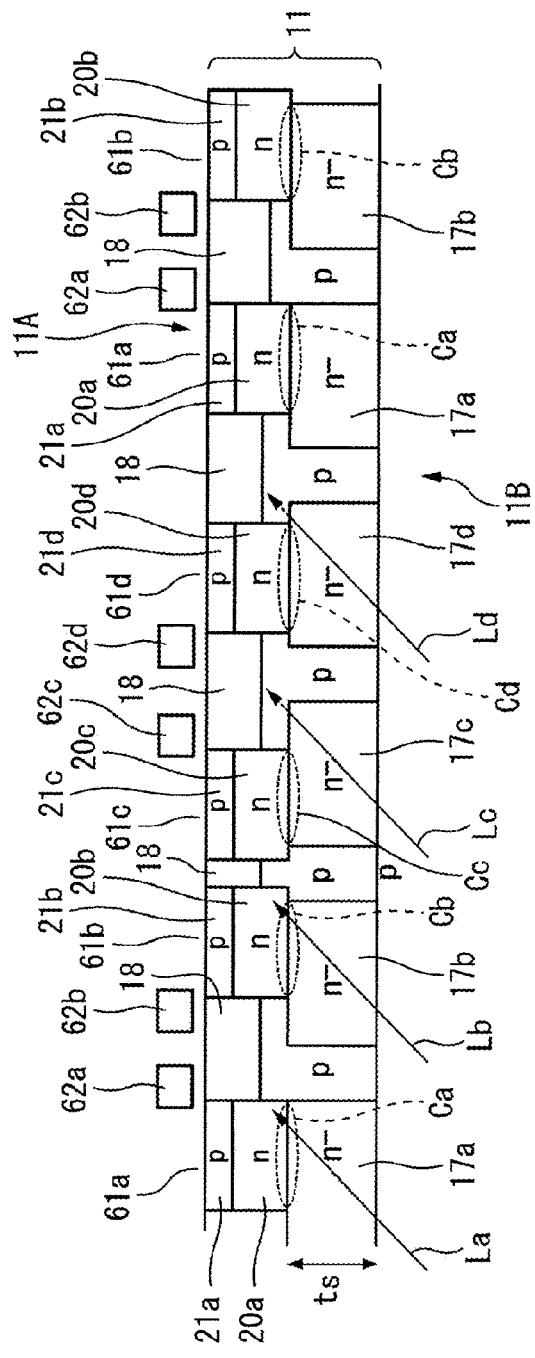
FIG. 5A
FIG. 5B

SOLID-STATE IMAGING DEVICE, PRODUCTION METHOD OF THE SAME, AND IMAGING APPARATUS

CROSS REFERENCE TO RELATED APPLICATIONS

This application is a continuation of and claims the benefit under 35 U.S.C. §120 of U.S. patent application Ser. No. 14/453,298, titled "SOLID-STATE IMAGING DEVICE, PRODUCTION METHOD OF THE SAME, AND IMAGING APPARATUS," filed on Aug. 6, 2014, which is a continuation of and claims the benefit under 35 U.S.C. §120 of U.S. patent application Ser. No. 14/257,644, filed on Apr. 21, 2014, now U.S. Pat. No. 9,281,337, which is a continuation of U.S. patent application Ser. No. 13/928,915, filed on Jun. 27, 2013, now U.S. Pat. No. 8,749,008, which is a continuation of U.S. patent application Ser. No. 13/438,425, filed on Apr. 3, 2012, now U.S. Pat. No. 8,497,561, which is a continuation of U.S. patent application Ser. No. 12/852,747, filed on Aug. 9, 2010, now U.S. Pat. No. 8,173,479, which is a division of U.S. patent application Ser. No. 12/124,496, filed on May 21, 2008, now U.S. Pat. No. 7,884,436, which claims the benefit under 35 U.S.C. §119 of Japanese Patent Application JP 2007-138081, filed on May 24, 2007. The entire contents of each of the foregoing applications are hereby incorporated herein by reference.

BACKGROUND OF THE INVENTION

The invention relates to a solid-state imaging device with a CMOS sensor for example, a production method of the same, and an imaging apparatus.

Recently, for the purpose of installing a camera function in a mobile apparatus such as a mobile phone, etc., demand for making a solid-state imaging device compact is increasing.

In a solid-state imaging device such as a CMOS image sensor, etc., generally a structure is adopted in which photodiodes (PDs) are arranged at constant intervals, for example, in a square lattice to sample incident light.

Therefore, the problem is arising that with downsizing of the solid-state imaging device as described above and miniaturization of the unit pixel due to the increase in the number of pixels, the area of a PD decreases and the characteristics of the solid-state imaging device, such as the saturation signal amount, the sensitivity, etc., decreases.

In the past, to prevent such decrease in the characteristics of the solid-state imaging device, a method has been adopted in which the decrease in the area of the PD is suppressed by decreasing the area of transistors in a unit pixel. However, there is a limit in keeping the characteristics of the solid-state imaging device with the method of keeping the area of the PD by decreasing the area of the transistors.

Japanese Unexamined Patent Application Publications No. 63-100879 and No. 2004-128193 describe a CMOS image sensor in which a pixel circuit other than the PD and the charge-transfer transistor are shared by neighboring unit pixels (see, for example, page 4, FIG. 4 of JP No. 63-100879 and paragraph numbers [0019]-[0040] and FIG. 2 of JP No. 2004-128193).

In the above-described CMOS image sensor, the number of transistors and the number of wirings per a unit pixel can be decreased, and as a result, a relatively large area can be secured for the PD, so that it is possible to cope with the miniaturization of the unit pixel.

SUMMARY OF THE INVENTION

However, in the structure described in the above-described JP Publications, in each unit pixel, a PD and a circuit region that is shared by neighboring unit pixels are mixed. In this case, because the shared region is arranged between neighboring unit pixels, the relative positions PDs occupy in the neighboring unit pixels generally differ between the neighboring unit pixels.

As a result, in the planar configuration, the PDs are arranged not in a square lattice but at uneven intervals.

When PDs are not arranged at even intervals, incident light is sampled, spatially at uneven intervals. In this case, the following problems arise.

a) The need to correct the sampled signal arises, so that as compared with the case that PDs are arranged at even intervals, signal processing becomes complicated.

b) If the arrangement of PDs differs depending on the type of the CMOS sensor, signal processing also has to be changed accordingly.

c) When an image with lights and darks in a stripe pattern is imaged, especially when the extending direction of stripes is oblique relative to the arrangement of pixels, it becomes difficult to reproduce intervals, colors, etc. of the stripes.

d) Because usual signal processing ICs are designed on the assumption that sampling is carried out at even intervals, it is highly likely that typical signal processing ICs may not be used and system structure is limited.

e) In the pixels in the periphery parts far from the optical axis, light is obliquely incident, so that the output manner of shading is caused to differ due to the arrangement at uneven intervals of the PDs. For example, even when a white subject is imaged, an upper edge and a lower edge thereof are colored and in addition, are colored in different colors, so that correction of the shading becomes difficult.

Because the above-described inconveniences arise, it is preferable that sampling of the incident light is carried out at even intervals.

To solve the above-described problems, in the past, the following methods have been taken.

1) Arranging transistors evenly around a PD so that PDs are arranged at even intervals 2) Providing an extra space so that PDs are arranged at even intervals 3) With respect to PDs arranged at uneven intervals, adequately narrowing the optical opening and arranging light incident regions at even intervals With respect to the above-described method 1), in almost all of various solid-state imaging devices such as a CMOS sensor, etc., because it is extremely difficult to arrange PDs at completely equal intervals, it results in reducing the area of the PDs and decreasing the characteristics of pixel circuits such as conversion gain, etc.

With respect to the above-described method 2), similarly, it results in reducing the area of the PDs and decreasing the characteristics of pixel circuits.

In the above-described method 3), there is an inconvenience that sensitivity is caused to fall.

As another example of a CMOS sensor, the applicant has proposed a rear-surface-incident-type CMOS sensor in Japanese Unexamined Patent Application Publication No. 2003-31785. The proposed rear-surface-incident-type CMOS sensor receives light from the rear side as illustrated in FIG. 1.

In FIG. 1, by polishing a substrate made of silicon, etc. by means of CMP (Chemical Mechanical Polishing), a silicon part 204 about 10-20 μm thick is formed. Gate electrodes 212 and wiring layers 211 are formed on one surface (i.e., the front surface) side of the silicon part 204 via an interlayer insulating layer and thereby a gate/wiring part 203 is formed. Further, a support substrate 201 is joined on the gate/wiring part 203 by means of an adhesive 202. Color filters 206 and on-chip lenses 207 are formed on the other surface (the rear surface) side of the silicon part 204 while sandwiching a $SiO_2$ film 205.

In the silicon part 204, impurity regions 214 of n-type for example, which become source and drain regions of the gate electrodes 212, and photoelectric conversion regions 213, each including a p-type impurity region and an n-type impurity region constituting a PD, are formed, and impurity regions 205 of n-type for example, which become light incident regions, are formed on the rear surface side of the silicon part 204 to be connected with the n-type impurity regions of the photoelectric conversion regions 213. Further, a p-type impurity region 216 is formed throughout on the surface on the rear surface side of the silicon part 204.

With the above-described configuration, in contrast to that in CMOS sensors in related art, a pixel structure of a front-surface-incident-type has been adopted, in which, the wiring layer side is made the front surface side and the incident light is taken in from the wiring layer side, in the example illustrated in FIG. 1, the incident light is taken in from the surface side opposite the wiring layer 211 (i.e., rear surface side), that is, the rear-surface-incident type structure is adopted. When the rear-surface-incident-type structure is adopted, as apparent from the incident light indicated by arrows 200 and the pixel structure, it is possible to avoid restriction in condensing due to vignetting at the wiring layers 211 and to thereby enhance condensing efficiency.

However, in the rear-surface-incident-type structure, only the designs in which PDs are arranged at even intervals are known. This is because that unless the PDs are arranged at even intervals, the above-described problems occur. Therefore, it is difficult to achieve both sharing of pixel circuits and arranging PDs at even intervals, as in the case of front-surface-incident-type structure.

The invention was conceived in view of the above-described and other problems and addresses avoiding, when pixel circuits are shared by a plurality of light reception regions, signal processing from becoming complicated due to the arrangement of the light reception regions at uneven intervals.

According to an embodiment of the invention, a solid-state imaging device includes a semiconductor substrate with a first surface and a second surface opposite the first surface, a plurality of light reception regions formed in the semiconductor substrate, respectively having first surface side regions formed in a first surface side part of the semiconductor substrate and second surface side regions formed in a second surface side part of the semiconductor substrate, and a pixel circuit formed on the first surface side of the semiconductor substrate and shared by the plurality of light reception regions. The second surface side, opposite the first surface side where the pixel circuit is formed, of the semiconductor substrate is made a light incident side of the light reception regions. The second surface side regions of the light reception regions formed in the second surface side part of the semiconductor substrate are arranged at approximately even intervals and the first surface side regions of the light reception regions formed in the first surface side part of the semiconductor substrate are arranged at uneven intervals, respectively, and the second surface side regions and the first surface side regions of the light reception regions are joined respectively in the semiconductor substrate so that the light reception regions extend from the second surface side to the first surface side of the semiconductor substrate.

According to another embodiment of the invention, an imaging apparatus includes a solid-state imaging device, an imaging optical unit guiding light from an imaging subject to the solid-state imaging device, and a signal processing unit processing an image signal outputted from the solid-state imaging device. The solid-state imaging device includes a semiconductor substrate with a first surface and a second surface opposite the first surface, a plurality of light reception regions formed in the semiconductor substrate, respectively having first surface side regions formed in a first surface side part of the semiconductor substrate and second surface side regions formed in a second surface side part of the semiconductor substrate, and a pixel circuit formed on the first surface side of the semiconductor substrate and shared by the plurality of light reception regions. The second surface side, opposite the first surface side where the pixel circuit is formed, of the semiconductor substrate is made a light incident side of the light reception regions. The second surface side regions of the light reception regions formed in the second surface side part of the semiconductor substrate are arranged at approximately even intervals and the first surface side regions of the light reception regions formed in the first surface side part of the semiconductor substrate are arranged at uneven intervals, respectively, and the second surface side regions and the first surface side regions of the light reception regions are joined respectively in the semiconductor substrate so that the light reception regions extend from the second surface side to the first surface side of the semiconductor substrate.

According to still another embodiment of the invention, a production method of a solid-state imaging device is provided. The production method includes steps of; implanting impurity of a first conductivity-type from a first surface side of a semiconductor substrate to form second surface side regions of light reception regions at approximately even intervals in a second surface side part of the semiconductor substrate; forming device separation regions in a first surface side part of the semiconductor substrate; forming gate electrodes on the first surface of the semiconductor substrate; implanting second conductivity-type impurity on the second surface side regions of the light reception regions from the first surface side of the semiconductor substrate to form first surface side regions of the light reception regions at uneven intervals in the first surface side part of the semiconductor substrate; forming an interlayer insulating layer and wiring layers on the first surface of the semiconductor substrate; and etching the semiconductor substrate from the second surface side opposite the first surface of the semiconductor substrate to expose the second surface side regions of the light reception regions arranged at approximately even intervals in the second surface side part of the semiconductor substrate. The step of implanting impurity from the first surface side of the semiconductor substrate to form the second surface side regions of the light reception regions is carried out before the step of forming the device separation regions.

As described above, in the solid-state imaging device and the imaging apparatus according to embodiments of the invention, a pixel circuit is shared by a plurality of light reception regions, and the solid-state imaging device is configured as a rear-surface-incident type device that the second surface side, opposite the first surface side where the pixel circuit is formed, of the semiconductor substrate is made a light incident side of the light reception regions. In particular, the first surface side of the light reception regions are arranged at uneven intervals in the first surface side part of the semiconductor substrate so that the pixel circuit to be formed on the first surface side of the semiconductor substrate can be arranged relatively reasonably, and at the same time, the second surface side regions of the light reception regions are arranged at approximately even intervals in the second surface side part of the semiconductor substrate. That is, the second surface side regions and the first surface side regions of the light reception regions are joined respectively in the semiconductor substrate so that the light reception regions extend from the second surface side to the first surface side of the semiconductor substrate. In other words, in the semiconductor substrate, respective light reception regions are formed so as to extend from the second surface side to the first surface side of the semiconductor substrate in shapes different from those of neighboring light reception regions, and they are arranged at uneven intervals on the first surface side of the semiconductor substrate and at approximately even intervals on the second surface side of the semiconductor substrate, respectively, and thereby deteriorating image quality and introducing complexity to signal processing can be avoided.

Further, according to the production method of the solid-state imaging device according to an embodiment of the invention, the solid-state imaging device with the above-described configuration can be relatively easily produced. In particular, because the second surface side regions of the light reception regions, which become the light incident regions on the rear surface side of the semiconductor substrate, are formed by implanting impurity from the first surface side of the semiconductor substrate in the relatively early step, the variation in the density of the impurity in the regions can be suppressed by diffusing the impurity in the subsequent heating step. Further, by carrying out the step of implanting the first conductivity-type impurity from the first surface side of the semiconductor substrate before the step of forming the device separation regions, the impurity does not pass the device separation regions, so that the second surface side regions of the light reception regions as the light incident regions can be formed in more uniform impurity density.

According to the solid-state imaging device and the imaging apparatus according to embodiments of the invention, in the case that a pixel circuit is shared by a plurality of light reception regions, deterioration of image quality and complication of signal processing due to that the light reception regions are arranged at uneven intervals can be avoided.

Further, according to the production method of the solid-state imaging device according to an embodiment of the invention, the solid-state imaging device avoiding signal processing from becoming complicated can be produced relatively easily, and in particular, it becomes possible to suppress variation in the impurity density in the impurity regions constituting the light reception regions.

BRIEF DESCRIPTION OF THE DRAWINGS

FIG. 4 is a schematic planer view illustrating an exemplary configuration of the solid-state imaging device when the pixel circuit illustrated in FIG. 3 is laid out on a planer surface.

FIG. 5A is a schematic planer view of apart of the planer view of FIG. 4.

FIG. 5B is a cross section on an AA' line in FIG. 5A.

DESCRIPTION OF THE PREFERRED EMBODIMENTS

Example of preferred embodiments of the invention will now be described with reference to drawings. The invention is not limited to the examples described below.

Figure 1:
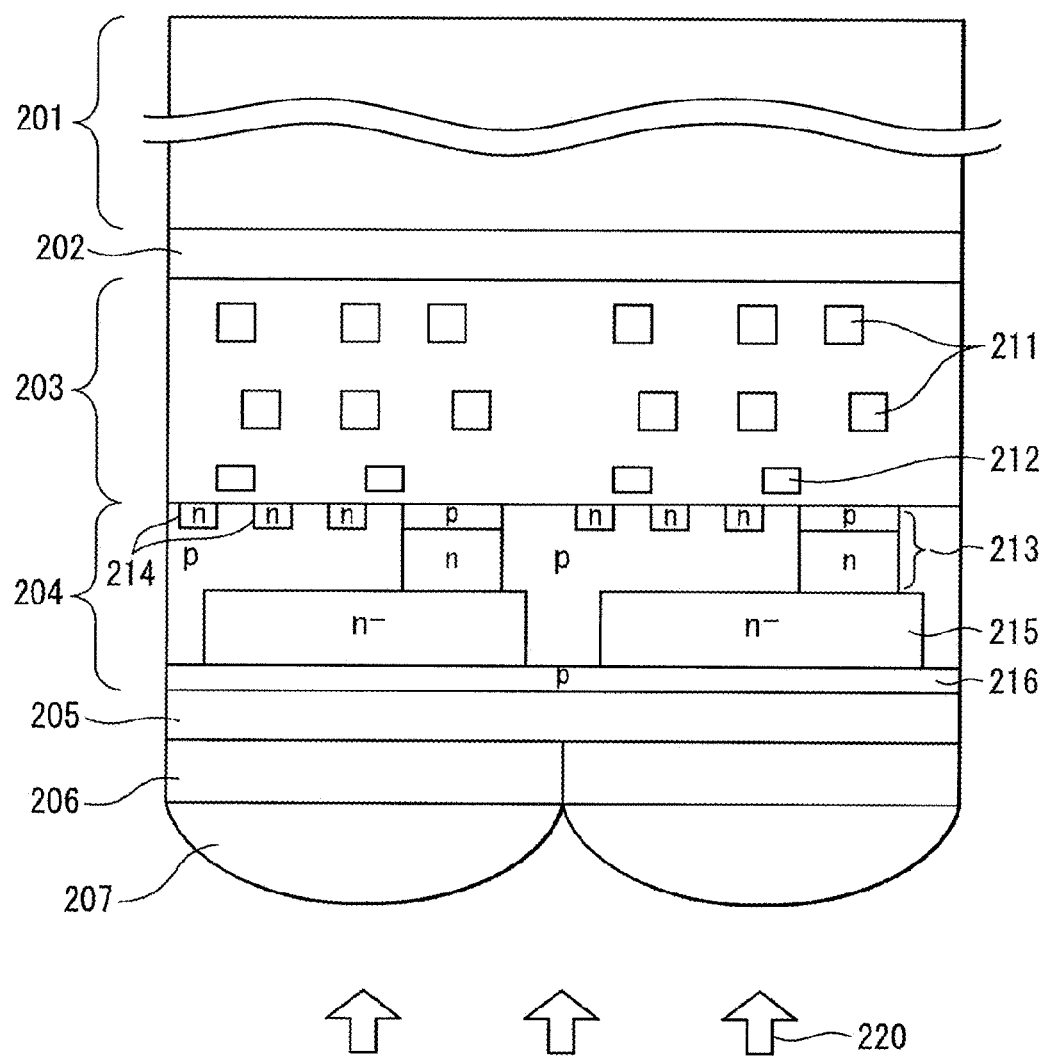
FIG. 1 is a schematic cross section illustrating a construction of an existing rear-surface-incident-type solid-state imaging device.
Figure 2:
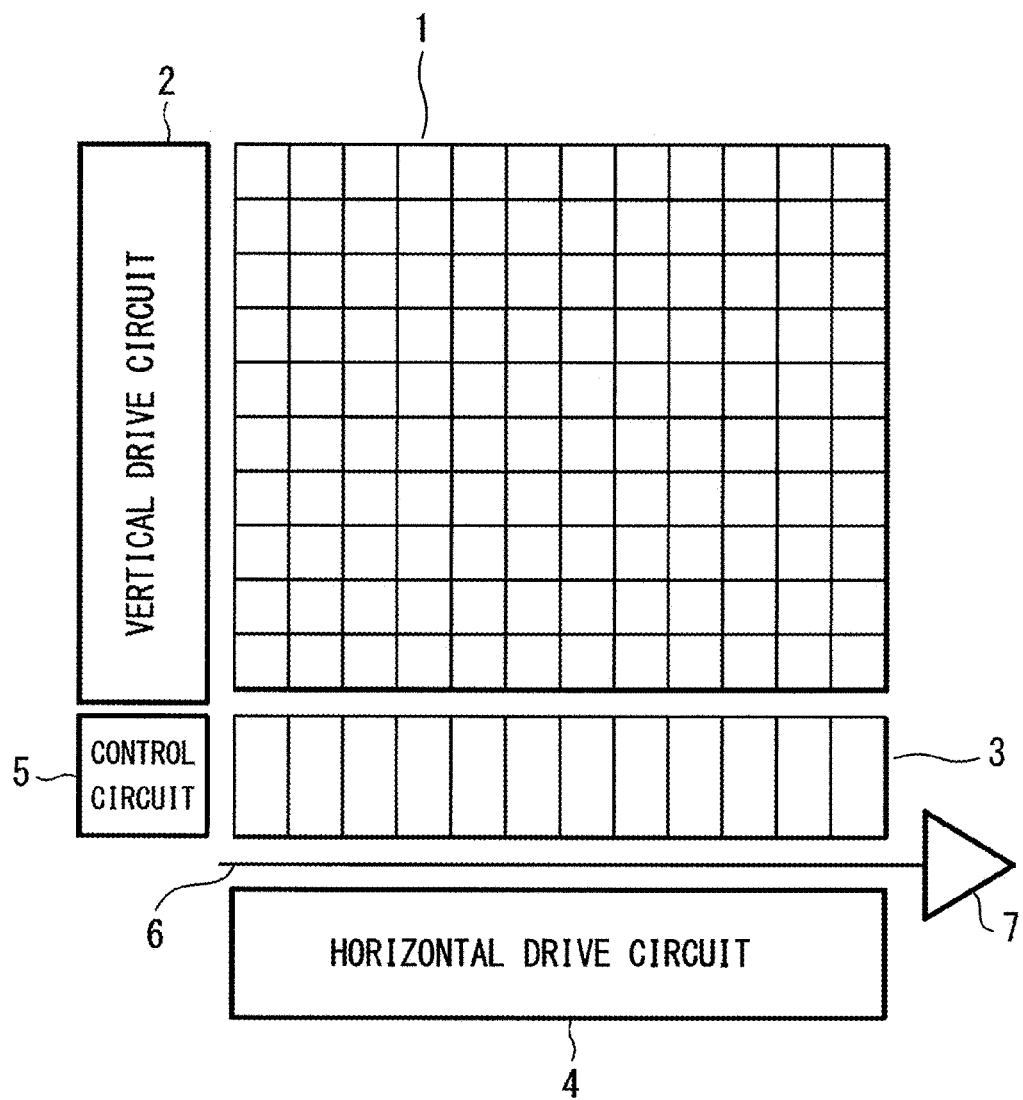
FIG. 2 is a schematic planer view of a solid-state imaging device according to an embodiment of the invention.

FIG. 2 is a schematic plan view of a solid-state imaging device according to an embodiment of the invention. As illustrated in FIG. 2, a solid-state imaging device 10 includes a pixel part 1, a vertical drive circuit 2, a column circuit 3, a horizontal drive circuit 4, a control circuit 5, a horizontal bus 6, and an output circuit 7. These parts are mounted on a substrate (not shown).

In the pixel part 1, a number of pixels are arranged in a line-column state. Further, a pixel drive wiring (not shown) extending in the line direction is arranged for each line of pixels, and a vertical signal line (now shown) extending in the column direction is arranged for each column of pixels.

Respective pixels of the pixel part 1 are driven by the pixel drive wiring. The signal for the pixel is an analog signal and is outputted to the vertical signal line.

The control circuit 5 receives input clocks, and data instructing an operation mode, etc., and outputs data such as internal information of the solid-state imaging device 10. Further, the control circuit 4 supplies clocks and pulses necessary for driving the vertical drive circuit 2, the horizontal circuit 4, the column unit 3, and the output circuit 7.

The vertical drive circuit 2 selects a pixel drive wiring, and supplies pulses for driving pixels to the selected pixel drive wiring. By driving a pixel drive wiring, pixels of one line associated with the pixel drive wiring are simultaneously driven.

In the column unit 3, columns circuits are arranged to correspond to the columns of pixels. The column circuits take in pixel signals of respective columns in the pixel part 1 from the vertical signal lines of the pixel part 1. The column unit 3 carries out CDS (Correlated Double Sampling), which is fixed-pattern noise removing processing, signal amplification processing, AD conversion processing, etc. on the taken-in pixel signals.

The horizontal drive circuit 4 sequentially selects column circuits of the column unit 3, and guides the signals held in the column circuits to the horizontal bus 6.

The output circuit 7 processes the signals from the horizontal bus 6 and outputs the processed signals. For example, sometimes only buffering is carried out, and sometimes processes are carried out, such as black level adjustment, column variation correction, various types of digital signal processing, etc.

Figure 3:
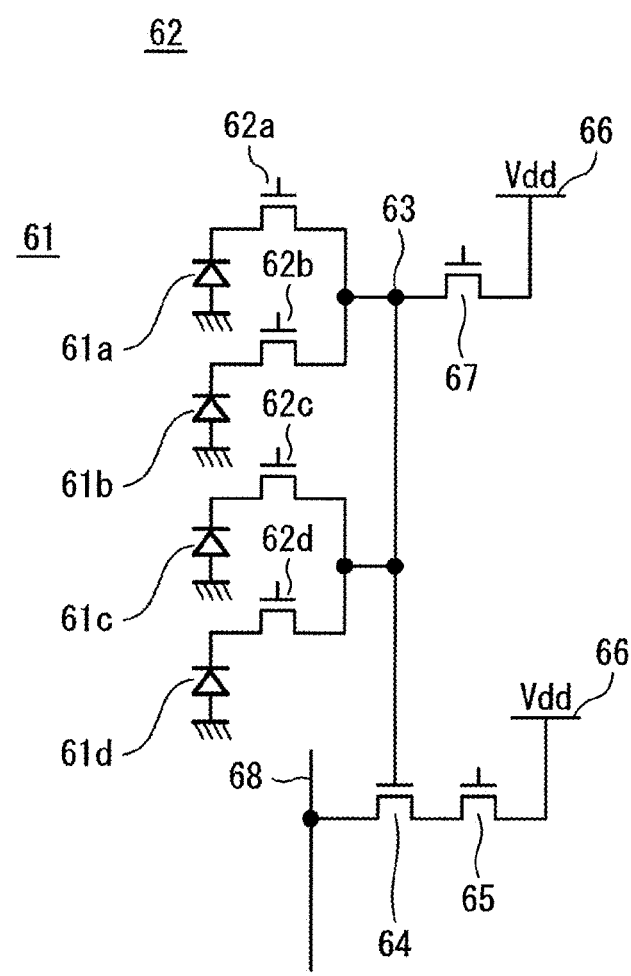
FIG. 3 is a schematic configuration diagram of a pixel circuit of the solid-state imaging device.

FIG. 3 illustrates an exemplary structure of a pixel circuit in a pixel of the solid-state imaging device 10. In this example, four sets of a light reception unit 61 (61a-61d), each including a photodiode (PD), etc. and constituting a light reception region, and a transfer transistor 62 (62a-42d) share a set of a reset transistor 67, an amplification transistor 64, and a selection transistor 65, constituting a pixel circuit.

The light reception units 61a-61d including PDs, etc. as photoelectric conversion elements are connected with a floating diffusion (FD) 63 via the transfer transistors 62a-62d, respectively. The floating diffusion 63 is a node including two diffusion layers corresponding to drains of the transfer transistors 62a-62d, gates of the amplification transistor 64, and a wiring connecting these diffusion layers and gates. The transfer transistors 62a-62d transfer photoelectrons of the light reception units 61a-61d to the floating diffusion 63. Because the voltage of the gates of the amplification transistor 64 is the one of the floating diffusion 63, if the selection transistor 65 is turned on, the amplification transistor 64 outputs a signal corresponding to the potential of the floating diffusion 63 to the vertical signal line 68. The reset transistor 67 resets the floating diffusion 63 by discharging the electrons of the floating diffusion 53 to a power source (Vdd) wiring 66.

FIG. 4 illustrates an exemplary configuration of the solid-state imaging device 10 when the pixel circuit illustrated in FIG. 3 is laid out on a planer surface. Here, for the sake of the viewability, metal wirings other than wirings 69 of the floating diffusion 63 and contacts between metal wirings are omitted. In FIG. 4, the direction of lines in FIG. 2 is indicated by an arrow x and the direction of columns in FIG. 2 is indicated by an arrow y. As illustrated in FIG. 4, the pair of the light reception units 61a, 61b and the pair of the light reception units 61c, 61d are respectively arranged substantially symmetrically in the column direction indicated by the arrow y, and the floating diffusion 63, the reset transistor 67, contact units 70, and the transfer transistors 62a, 62b, 62c, 62d of the light reception units 61a, 61b, 61c, 61d are disposed between the light reception units 61a, 61b, 61c, 61d thus arranged. Specifically, they are disposed between the light reception unit 61a and the light reception unit 61b and between the light reception unit 61c and the light reception unit 61d, that is, in every other in-between space of light reception units with respect to the column direction. In this case, an interval D1 of the light reception unit 61b and the light reception unit 61c and an interval D2 of the light reception unit 61c and the light reception unit 61d are different, so that the light reception units are arranged at uneven interval.

The cross section structure of the pixel circuit is described referring to FIG. 5A and FIG. 5B. FIG. 5A illustrates a part of the schematic planer diagram of FIG. 4, and FIG. 5B illustrates a cross section structure at an AA' line of FIG. 5A. In FIG. 5A and FIG. 5B, the parts corresponding to those in FIG. 4 are denoted by the same reference symbols and overlapped description is omitted. In FIG. 5A, for the convenience sake, the planar structure diagram illustrated in FIG. 4 is rotated 90 degrees transversely. In FIG. 5B, the wirings, the support substrate, the color filter, the on-chip lens, etc. are omitted and only a semiconductor substrate 11 consisted of silicon, etc., and the transfer transistors 62a-62d are illustrated.

The invention is characterized in that the shapes in the depth direction of the light reception units 61a-61d are made different between neighboring pixels. In the illustrated example, in the part on the first surface 11A side where pixel circuits are formed of a semiconductor substrate 11, second conductivity-type impurity regions 21a-21d for example of p-type and first-type impurity regions 20a-20d for example of n-type are formed at uneven intervals separated by device separation regions 18, as first surface side regions of the light reception regions. On the other hand, in the part on the second surface 11B side, which is on the opposite side of the first surface 11A side where pixel circuits are formed and which is on the light incident side, of the semiconductor substrate 11, first conductivity-type impurity regions 17a-17d for example of n⁻-type of relatively low density, which are connected with the first conductivity-type impurity regions 20a-20d, are formed at uneven intervals, as second surface side regions of the light reception regions, and thereby the light reception regions 61a-61d are formed.

At this time, as indicated by broken lines Ca-Cd, junction parts of the first surface 11A side regions, i.e., the second conductivity-type impurity regions 21a-21d and the first-type impurity regions 20a-20d, and the second surface 11B side regions, i.e., the first conductivity-type impurity regions 17a-17d, of the light reception units 61a-61d are differently shaped depending on the arrangement positions of the impurity regions in the first surface 11A side part and the arrangement positions of the impurity regions in the second surface 11B side part. That is, in this example, the junction parts Ca-Cd are formed differently in junction position and area between neighboring pixels, so to say, within the semiconductor substrate 11, impurity regions are connected with each other while being bent. By thus selecting the injunction positions appropriately, the light reception units 61a-61d can be arranged at approximately even intervals in the second surface 11B side part of the semiconductor substrate 11, which is the light incident side, even if the arrangement thereof is at uneven interval in the first surface 11A side part, so that spatial sampling of pixels is carried out approximately at even intervals.

Accordingly, the problems that have been addressed in the past either by sacrificing the characteristics of pixels or by bending the optical path are solved in the invention by bending the path of photo-electrically converted electrons pixel by pixel.

It should be noted that the number of layers of impurity regions is not limited to the illustrated one, and can be two or four or more. However, it is preferable that the junction surfaces of the p-type regions and the n-type regions have approximately the same shape and area in respective pixels. Further, the p-type and the n-type may be reversed.

When the structures in the depth direction of the light reception units are different between neighboring pixels, there is a possibility that shading occurs depending on the difference of the structures. That is, in FIG. 5B, when light enters at a slanted angle from the second surface 11B side as indicated by arrows La-Ld, depending on the difference in the relative positions between the first conductivity-type impurity regions 17a-17d and the junction parts surrounded by the broken lines Ca-Cd, there is a possibility that the light reaches or the light does not reach the first conductivity-type impurity regions 20a-20d on the first conductivity-type impurity regions 17a-17d. In the illustrated example, the light does not reach the first conductivity-type impurity regions 20c and 20d as indicated by the tip ends of the arrows Lc and Ld in the regions 20c and 20d.

To avoid such variation, it is important that photoelectrical conversion is sufficiently performed in the first conductivity-type impurity regions 17a-17d arranged at approximately even intervals in the second surface 11B side part of the semiconductor substrate 11 and that a large amount of light does not pass through the regions 17a-17d. Therefore, it is preferable that the first conductivity-type impurity regions 17a-17d extend 1 µm or more from the second surface 11B in the depth direction of the semiconductor substrate 11. Further, to deplete the regions 17a-17d to transmit photo-electrically converted electrons to the first surface 11A side by an electric field, it is preferable that a depth "ts" from the second surface 11B is 5 µm or less.

Next, a production method of the solid-state imaging device 10 according to an embodiment of the invention is described referring to production process diagrams of FIG. 6A through FIG. 10. Description will be made only with respect to the principal points taking a part of the regions illustrated in FIG. 5B as an example.

Figure 6A:
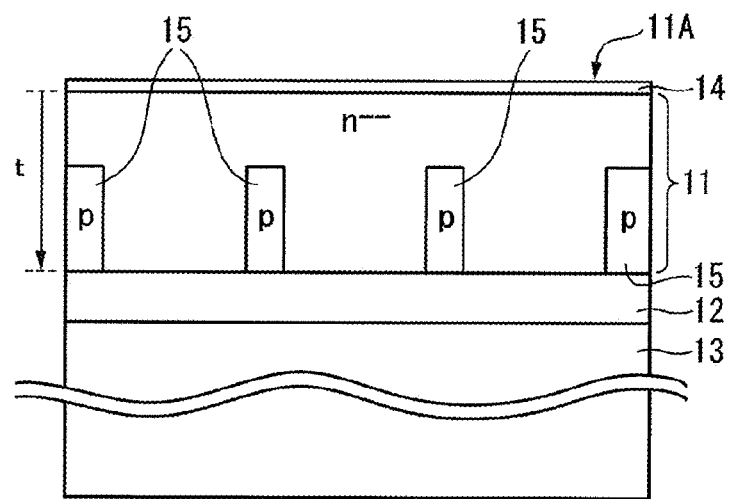
FIG. 6A, FIG. 6B, and FIG. 6C are production process diagrams of a first part of a production method of the solid-state imaging device according to an embodiment of the invention.

Process (1):

This example is the case that a SOI (Semiconductor On Insulator) substrate is used, and as illustrated in FIG. 6A, a silicon part, which is formed on a substrate 13 consisted of silicon, etc. through an insulating film 12 consisted of an embedded oxide film, etc., may be used as a semiconductor substrate 11. That is, the semiconductor substrate in the solid-state imaging device according to an embodiment of the invention may be a semiconductor region provided in a part of a substrate. A thickness "t" of the silicon part when the SOI substrate is used, i.e., the semiconductor substrate 11, is preferably relatively thick, for example, about 4 µm, and the semiconductor substrate 11 can be the first conductivity-type of low impurity density about $10^{15}$ cm$^{-3}$, for example, n$^{--}$-type.

After thinly forming an insulating film 14 by thermal oxidation on the surface of the semiconductor substrate 11, second conductivity-type impurity regions 15 are formed for example in the region 1.8 µm deep or more by implanting, for example, boron, etc., which is p-type impurity. When carrying out ion implantation to a relatively deep region from the surface, it is preferable to use a high-energy ion implantation apparatus capable of handling mega electron volt. The second conductivity-type impurity regions 15 are formed with its planer shape being made, for example, in a lattice shape and are arranged at even intervals.

Figure 6B:
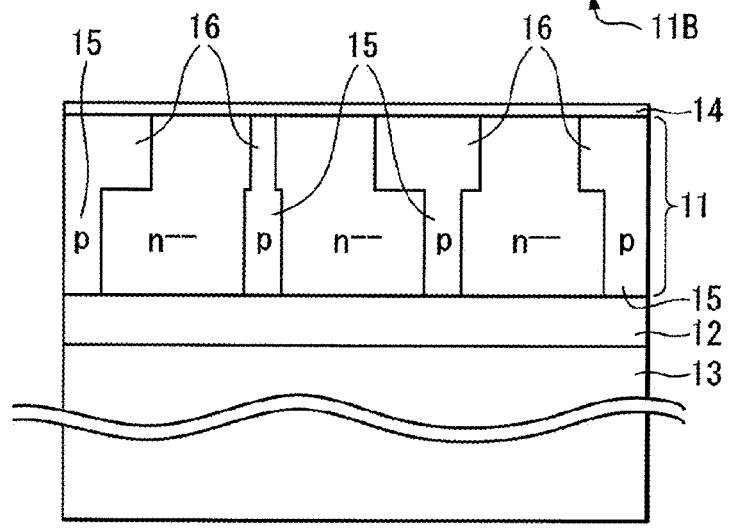

Process (2):

As illustrated in FIG. 6B, in the region 1.8 µm deep or more from the first surface 11A of the semiconductor substrate 11, second conductivity-type impurity such as boron, etc. is implanted while avoiding the regions that will become the upper parts, i.e., first surface 11A side regions, of the light reception units in subsequent processes, and thereby second conductivity-type impurity regions 16 to be connected with the second conductivity-type impurity regions 15 are formed.

Because the first surface side regions of the light reception units are to be arranged at uneven intervals, the junction parts with the second conductivity-type impurity regions 15 in the deep position implanted in the above-described Process (1) are different in shapes, i.e., different injunction positions and in junction areas, between neighboring pixels.

Figure 6C:
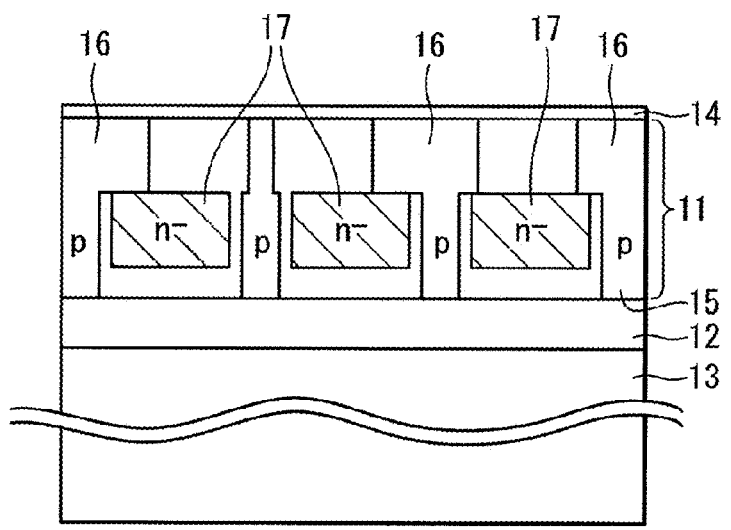

Process (3):

Next, as illustrated in FIG. 6C, in the region in the depth not reaching the insulating layer 14, i.e., in the depth from about 1.8 µm to about 3.5 µm from the first surface 11A, first conductivity-type impurity regions 17 of n$^-$-type, which will become the lower parts, i.e., second surface 11B side regions, of the light reception units, are formed by carrying out ion implantation of first conductivity-type impurity of n-type. In this case also, impurity implantation is carried out using a high-energy ion implantation apparatus capable of handling mega electron volt as in the above-described second conductivity-type impurity regions 15.

This ion implantation is carried out to the opening parts of the lattice shape of the first conductivity-type impurity regions 15 formed in the above-described Process (1), so that the first conductivity-type impurity regions 17 are arranged at even intervals.

However, in this case, because the configurations of the pixels in the first surface 11A side regions are different between neighboring pixels, damages to the vicinity of the surfaces of the pixels due to ion implantation differ between the neighboring pixels. Therefore, so as to reduce the difference in the degrees of damages to the vicinity of the surfaces of pixels between neighboring pixels, as the ion for use in the ion implantation, the one with small atomic weight, for example, phosphorus is preferably used.

On the other hand, to collect the electrons to the first surface 11A side of the light reception units, that is, to the wiring circuit side, it is preferable to configure such that the impurity density increases toward the first surface 11A side. Therefore, it is suitable to ion implant while increasing the dosing amount several times toward the first surface 11A side.

Here, with respect to ion implanting to such a deep region, a method is also conceivable to ion implant, after once exposing the second surface 11B, i.e., the rear surface, from the rear surface side with relatively low energy. However, in the present embodiment, in the above-described Process (3), ion implantation is carried out from the first surface 11A side, i.e., from the front surface side of the semiconductor substrate 11, with relatively high energy. The reasons for that are as follows.

In the solid-state imaging device according to an embodiment of the invention, the junction positions of the first surface side regions and the second surface side regions of the light reception units are different between neighboring pixels. Because of this, if a difference exists locally in the density of impurity such as phosphorus, etc., there is a possibility that variation is caused in sensitivity, saturation, afterimage, etc. between neighboring pixels. To avoid or suppress such variation, it is preferable to diffuse impurity more after ion implantation so that the local density difference becomes small and the density distribution becomes gentle. To achieve this, a relatively strong heating process is to be applied after implantation, however, if such a heating process is applied, other ions are also diffused, so that the ion implantation process to the rear surface side regions, i.e., the second surface side regions of the light reception units is carried out before device separation regions in which details have not been formed yet are formed.

At this time, the relatively strong heating process that is carried out for the subsequent formation of device separation regions can be used for diffusing the impurity of the first conductivity-type impurity regions 17 as the second surface 11B side regions, so that there is an advantage that adding another process is avoided.

Carrying out ion implantation in this stage means that ion implantation is inevitably carried out from the first surface 11A side. In the above-described Processes (1) through (3), ion implantation is carried out to the area slightly narrow than the finally implanted area, and by means of diffusion by heating processes for subsequent formation of device separation areas, the distribution is made to be gently overlapped. Thereby, density gradient that is gentle in the horizontal direction also is generated, and it becomes easy to move electrons to the first surface 11A side regions of the light reception units.

Furthermore, when implanting impurity from the first surface 11A side, if implantation is carried out after formation of device separation regions, the implantation depth is caused to differ between the parts where the impurity passes the device separation regions and the parts where the impurity passes the areas other than the device separation areas. If all of the pixels are laid out in the same manner, the problem is relatively small, however, when the circuit configuration is the one shared by a plurality of pixels as in the solid-state imaging device according to an embodiment of the invention, because the layout, i.e. the arrangement, of neighboring pixels are different, the variation in the implantation depths of ions as described above becomes the cause of generating a variation in sensitivity, saturation characteristics, etc. between neighboring pixels. Accordingly, when ion implantation is carried out from the first surface 11A side, because of the above-described reason also, it is preferable to carry out the ion implantation before formation of device separation regions.

Figure 7A:
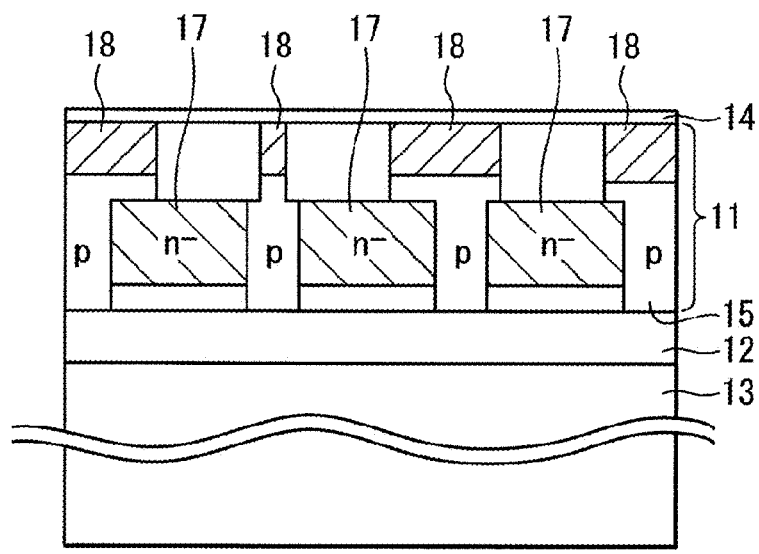
FIG. 7A, FIG. 7B and FIG. 7C are production process diagrams of a second part of the production method of the solid-state imaging device.

Process (4):

Next, as illustrated in FIG. 7A, device separation regions 18 are formed. Here, STI (Shallow Trench isolation) is used, in which a trench is formed in the semiconductor substrate 11 of silicon, etc. and for example $SiO_2$ is buried in the trench. Because it passes through the heating process at about 950° C. on the way, as described above, more ions implanted in the previous processes are diffused.

Figure 7B:
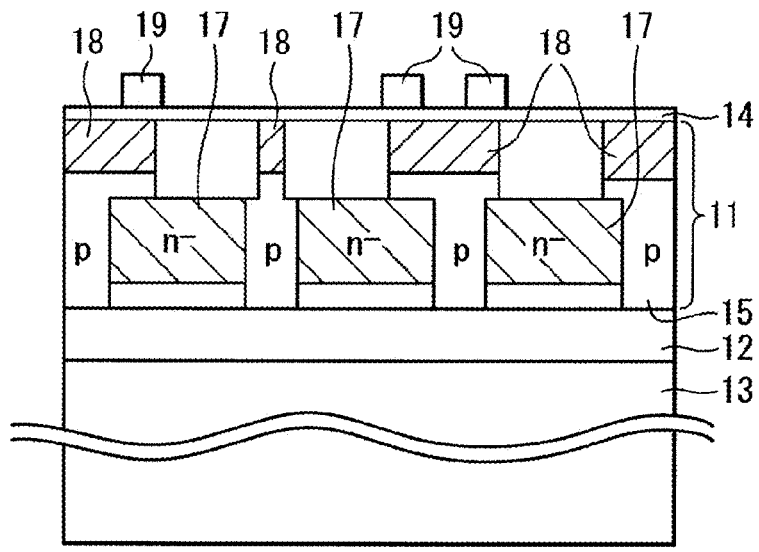

Process (5):

Thereafter, as illustrated in FIG. 7B, gate electrodes 19 are formed through the insulating layer 14.

Figure 7C:
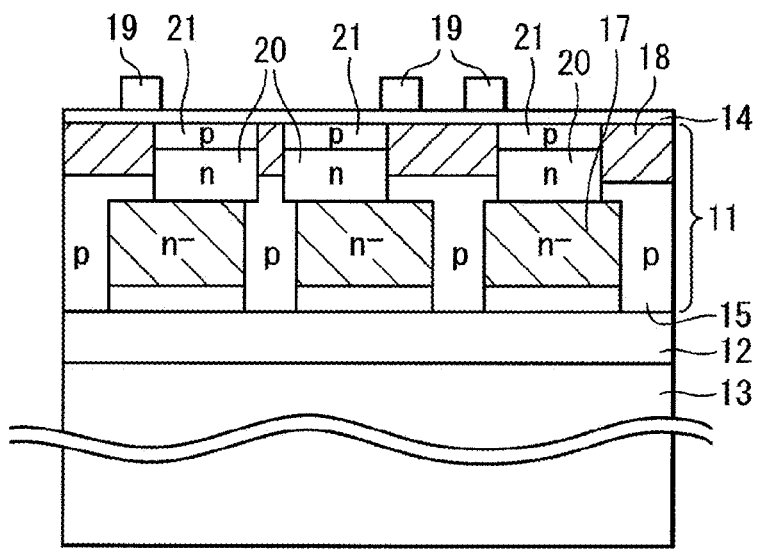

Process (6):

As illustrated in FIG. 7C, the structures in the first surface 11A side regions of the light reception units are formed. For example, arsenic, etc. of the first conductivity-type, in this case, of n-type, are ion implanted to form first conductivity-type impurity regions 20. Then, although not shown, side walls of the gate electrodes 19 are formed, and boron, etc. of the second conductivity-type, in this case n-type, are ion implanted and are activated without being diffused so much through a light heating process at bout 850° C. Although not shown, sources and drains of transistors are also formed in this process.

Figure 8:
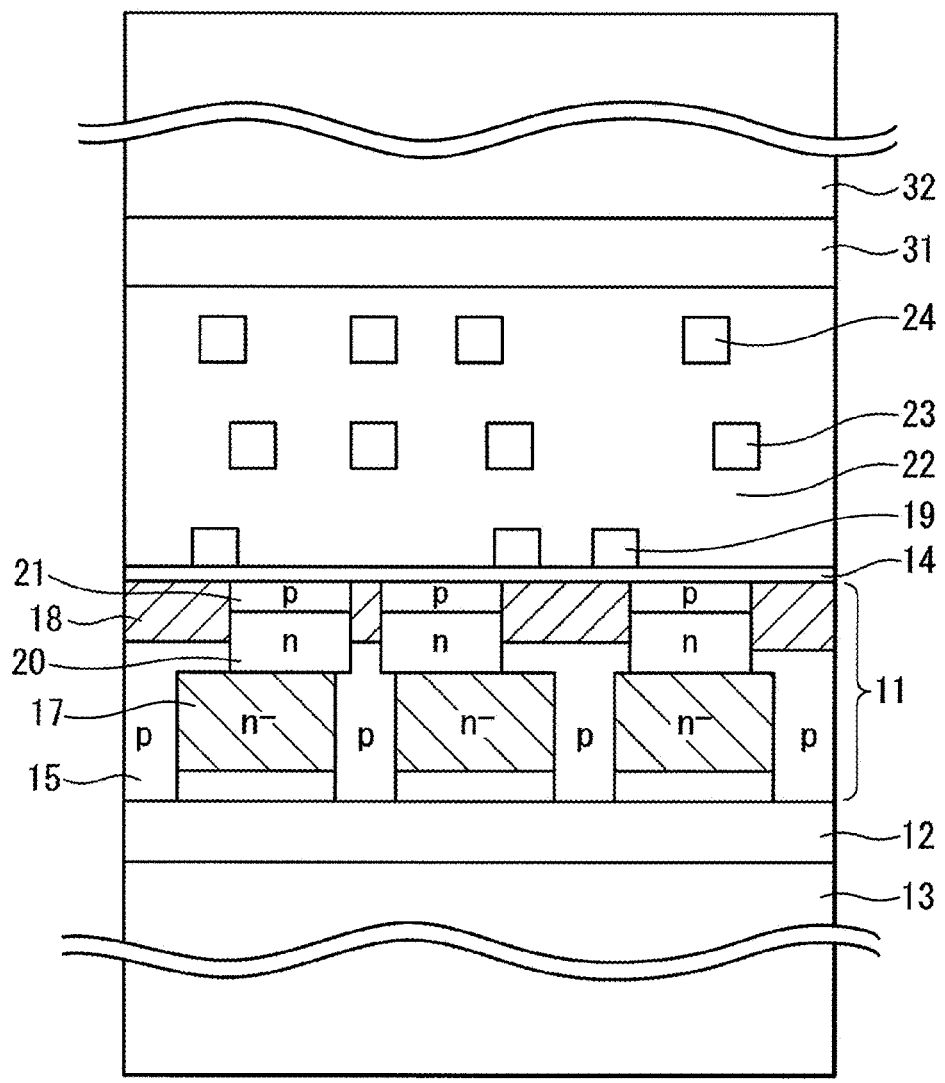
FIG. 8 is a production process diagram of a third part of the production method of the solid-state imaging device.

Process (7):

As illustrated in FIG. 8, wiring layers 23 and 24 are formed above the gate electrodes 19 through an interlayer insulating layer 22, and a support substrate 32 of silicon, etc. is stuck by means of an adhesive 31 of BCB (benzocyclobutene) resin, etc.

Figure 9:
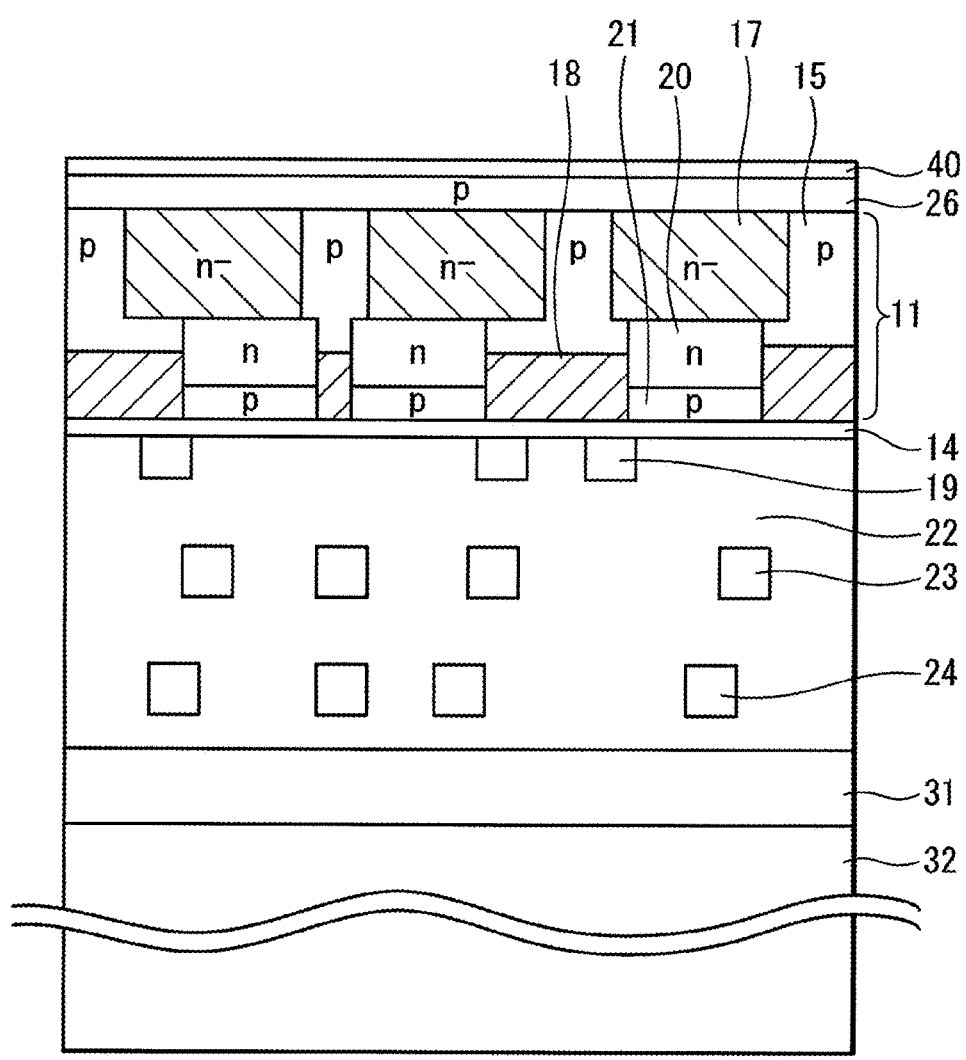
FIG. 9 is a production process diagram of a fourth part of the production method of the solid-state imaging device.

Process (8):

Thereafter, the semiconductor substrate 11, i.e., SOI substrate, is reversed, the substrate 13 of the SOI and the insulating layer 12 formed by an embedded oxide film are removed by polishing and etching to expose the second surface 11B. Further, a thin protective oxide film is formed on the surface of the second surface 11B, and as illustrated in FIG. 9, boron, etc. are ion implanted to the surface on the second surface 11B side, and activation is carried out by means of laser annealing, etc. to form a second conductivity-type impurity layer 26 of p-type. Furthermore, an oxide film 40 is formed thereupon.

Figure 10:
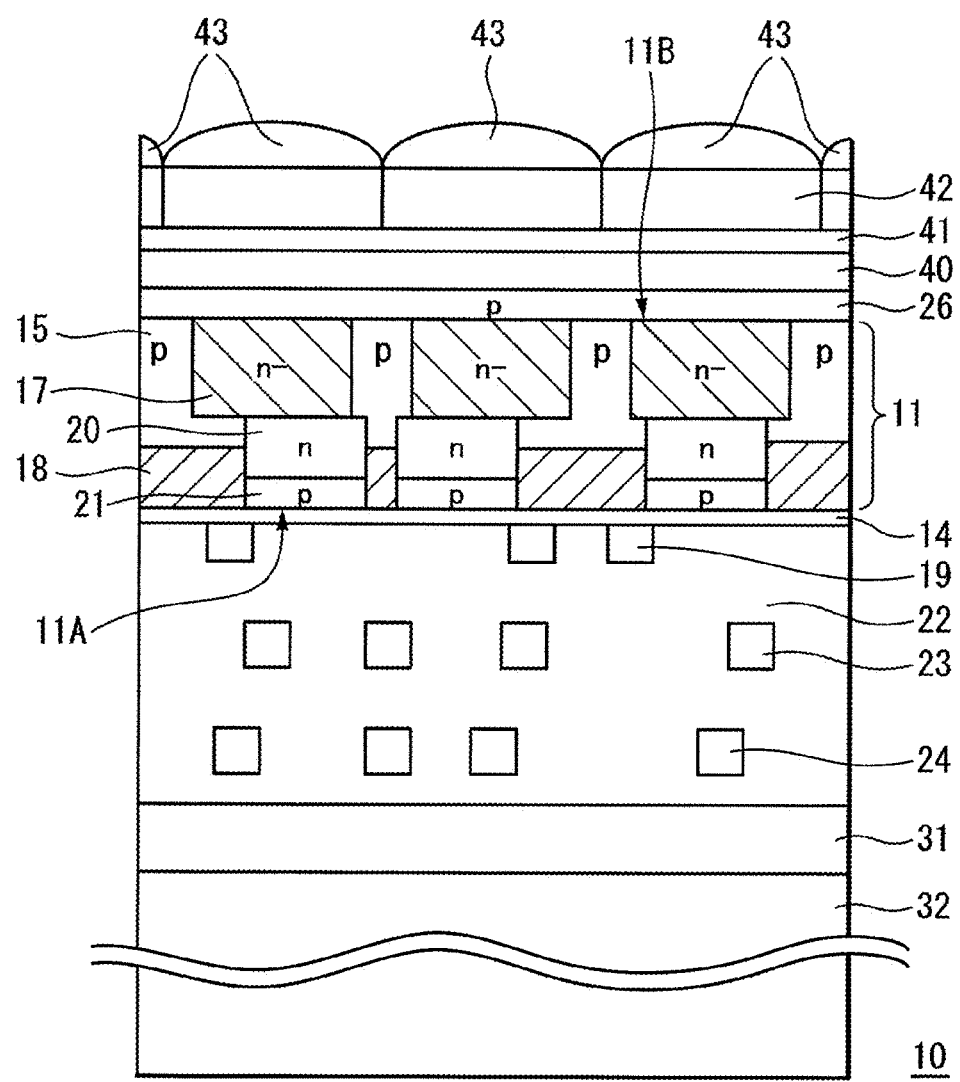
FIG. 10 is a production process diagram of a fifth part of the production method of the solid-state imaging device.

Process (9):

Thereafter, as illustrated in FIG. 10, a protective film 41 consisted of a silicon nitride film, etc. is formed on the oxide film 40 on the second surface 11B, and furthermore, color filters 42 and on-chip lenses 43 are formed. The color filters 42 and the on-chip lenses 43 are formed at approximately even intervals in positions corresponding to the second conductivity-type impurity regions 21 and the first conductivity-type impurity regions 20 and 17, which constitute the light reception units.

Here, in the invention, the even intervals need not be complete and strict even intervals, and it would be sufficient if the evenness is at a level that there is no problem from a practical point of view, and more specifically, if it is in a range that special signal processing for correcting variation in the intervals of the light reception units is unnecessary.

Further, in the solid-state imaging device according to an embodiment of the invention, the arrangements are different between the first surface side regions and the second surface side regions of the light reception units, that is, between the front surface side regions and the rear surface side regions of the light reception units, however, it is preferable that the optimum arrangement is selected as their relative positional relationship. As an example, as in the above-described embodiment, when pixels are arranged in units of four pixels, the optimum arrangement can be selected using the following method.

Suppose that geometric gravity centers in the front surface side regions of the light reception units for example PDs are arranged at uneven intervals in positions of points p1, p2, p3, and p4 on the coordinate axes, and those in the rear surface side regions of the light reception units are arranged at even intervals in positions of points q1, q2, q3, and q4 on the coordinate axes. In this case, to determine the relative relationship of the geometric gravity centers between the front surface side regions and the rear surface side regions of the light reception units, the maximum value pi–qi and the minimum value pj–qj (each of i and j is one of 1, 2, 3, 4) of p1–q1, p2–q2, p3–q3, and p4–q4 have only to satisfy; pi–qi=–(pj–qj). This means that the maximum value of deviation in the geometric gravity centers between the front surface side and the rear surface side of the PDs is made minimum.

In the example of FIG. 5B, the maximum value and the minimum value of the deviation in the geometric gravity centers are given by the light reception units 61b and 61c, and the light reception units 61a and 61d take the values between the maximum value and the minimum value. The light reception units 61b and the light reception unit 61c are in the same shape if left and right are reversed, however, if they remain as they are, the shapes of the light reception unit 61b and the light reception unit 61c relative to the incident light Lb and the incident light Lc are different, so that the light reception units 61b and the light reception unit 61c are different in shapes.

Note that it is apparent that this method can be applied to cases other than the case that pixels are arranged in units of four pixels.

Figure 11:
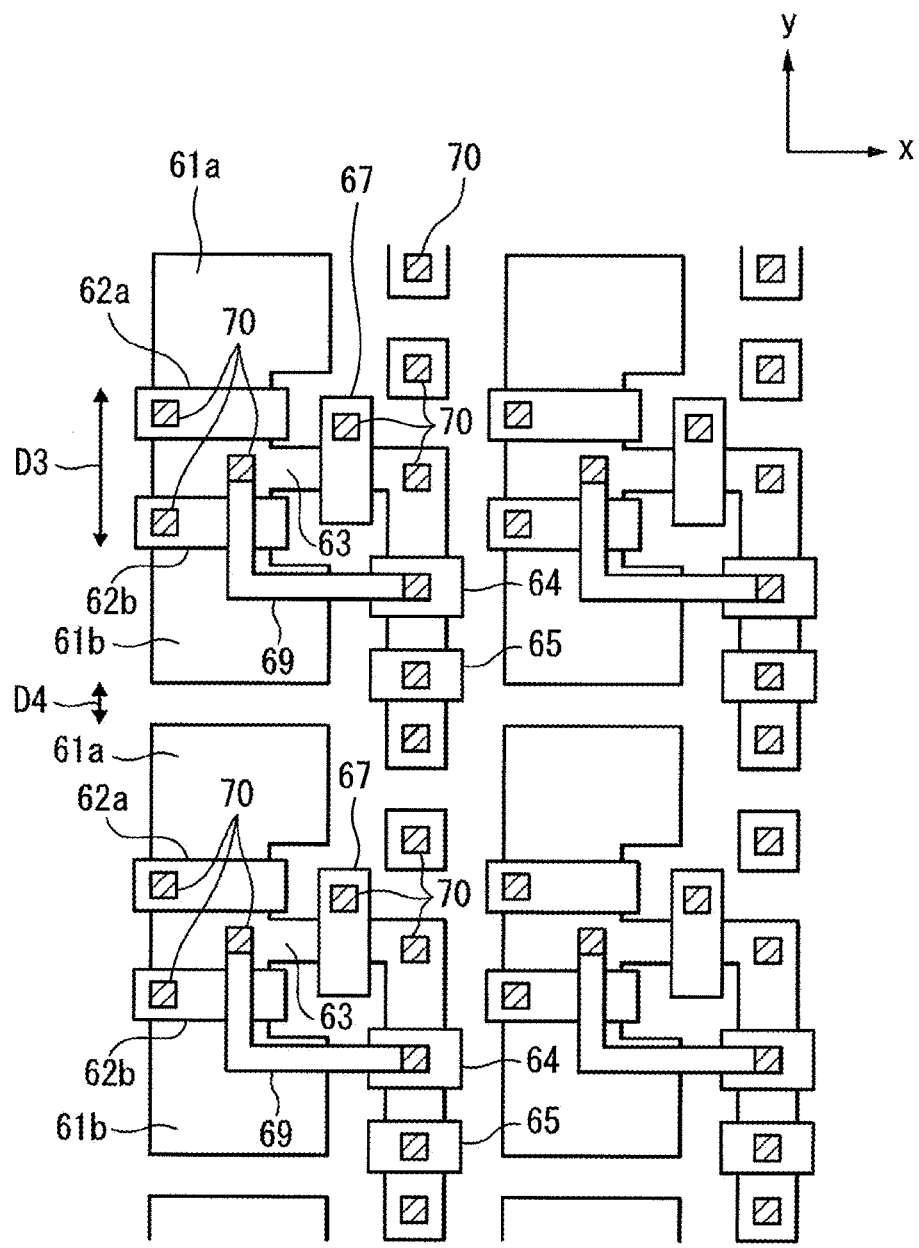
FIG. 11 is a schematic planer configuration diagram of a principal part of the solid-state imaging device according to another embodiment of the invention.
Figure 12:
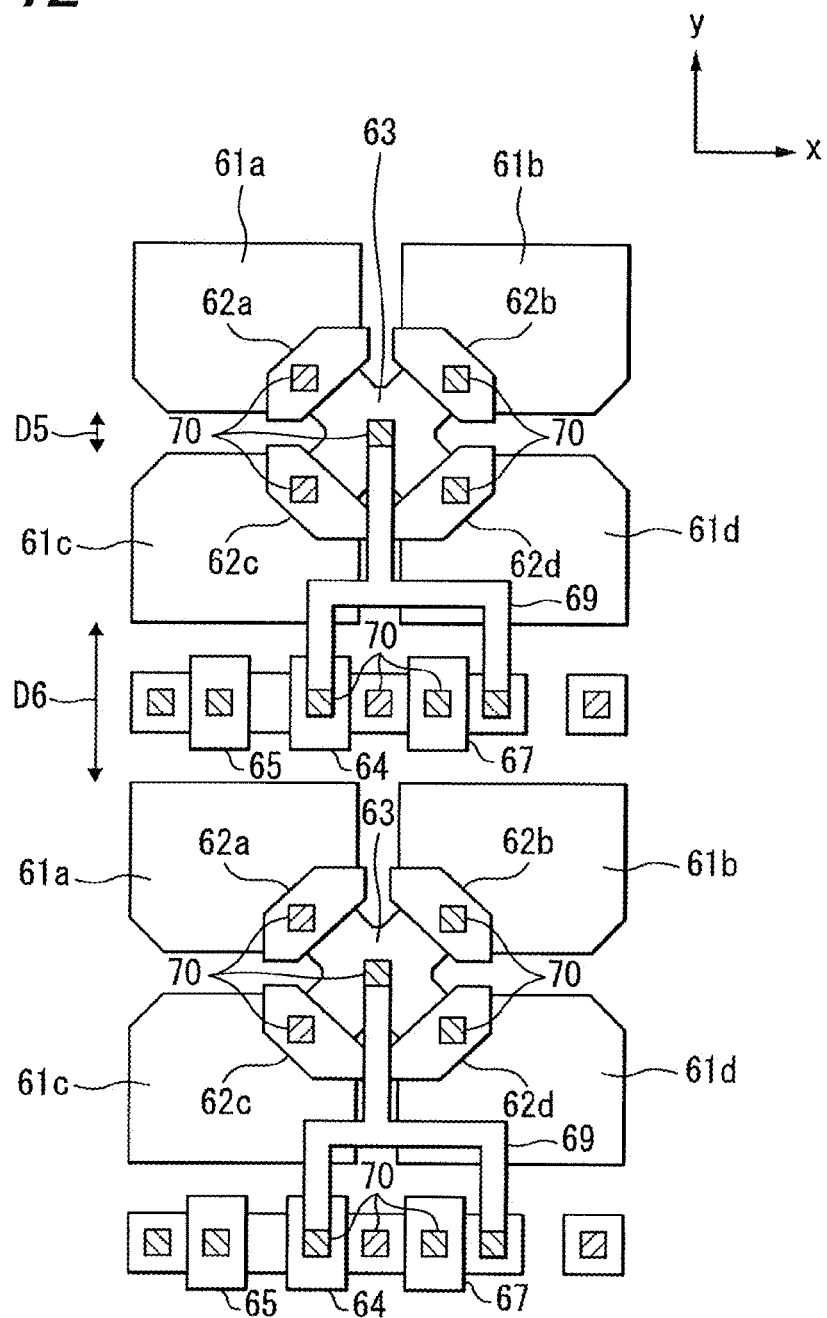
FIG. 12 is a schematic planer configuration diagram of a principal part of the solid-state imaging device according to another embodiment of the invention.

So far, the description has been made taking the example of configuration that four pixels in the column direction are shared; however, various other configurations have been proposed in the pixel sharing method. For example, the configuration that two neighboring pixels in the column direction are shared as illustrated in FIG. 11 has been known, and also the configuration that two pixels each in the column direction and in the line direction, i.e., four pixels in two lines and two columns, are shared as illustrated in FIG. 12 has been known. In FIG. 11 and FIG. 12, the parts corresponding to those of FIG. 4 are denoted by the same reference symbols and overlapped description is omitted. The invention can be similarly applied, including the cases of FIG. 11 and FIG. 12, to various solid-state imaging devices sharing pixel circuits by a plurality of pixels. It should be noted that in the example illustrated in FIG. 11, the wirings 69 are arranged over the light reception units, however, because the solid-state imaging device of the invention is configured as the rear-surface-incident-type device, there should be no problem. In the known front-surface-incident-type device, the configuration that wirings cross over the PDs may not be adopted because incident light is hindered. However, by adopting the rear-surface-incident-type configuration, the freedom in the wiring arrangement can be increased as described above, so that further miniaturization of pixels and circuits becomes possible.

Figure 13:
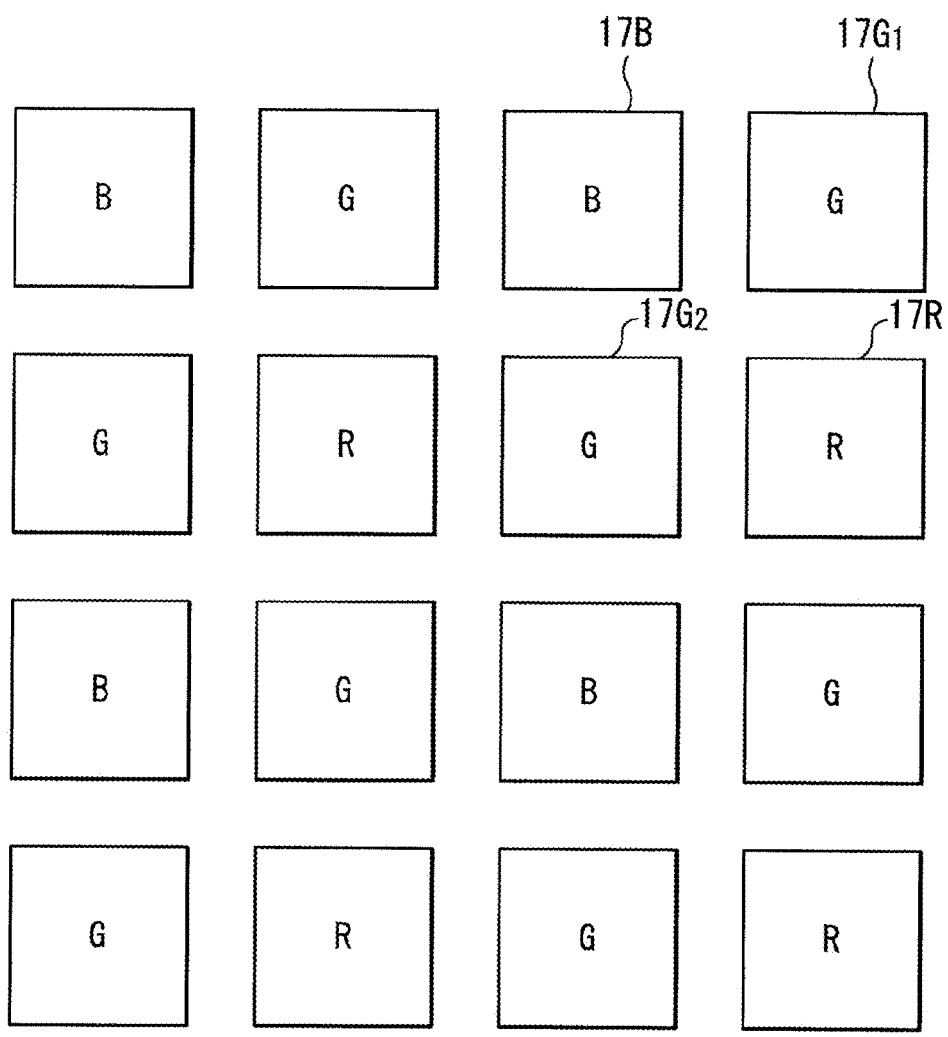
FIG. 13 is a schematic planer configuration diagram of a pixel part of the solid-state imaging device according to another embodiment of the invention.

FIG. 13 illustrates an exemplary planer configuration of the light reception units viewed from the rear surface side, i.e., the second surface 11B side, of the solid-state imaging device according to an embodiment of the invention. As illustrated in FIG. 13, in this example, the first conductivity-type impurity regions 17, which are the second surface side 11B regions and the incident side regions of the light reception units 61, are arranged at approximately even intervals. As one example, there is shown in FIG. 13 an arrangement example of the first conductivity-type impurity regions 17 corresponding to respective colors, green (G), red (red), and blue (B), in the color solid-state imaging device for use in a single-CCD camera.

As described above, in the solid-state imaging device according to an embodiment of the invention, making the arrangement of the second surface side regions, i.e., rear surface side regions, of the light reception units at approximately even intervals need not be complete and strict necessarily, and is sufficient if that is within a range that there is no problem from a practical point of view. That is, even if the intervals slightly vary, there would be no problem if the intervals are at such a level that in subsequent signal processing, sampling can be treated as being carried out at even intervals.

Further, although it is preferable that all of the shapes and areas of the second surface 11B side regions, i.e., first conductivity-type impurity regions 17, of the light reception units 61 are the same, however, if they are arranged at even intervals, all of the shapes and areas need not be necessarily the same.

Figure 14:
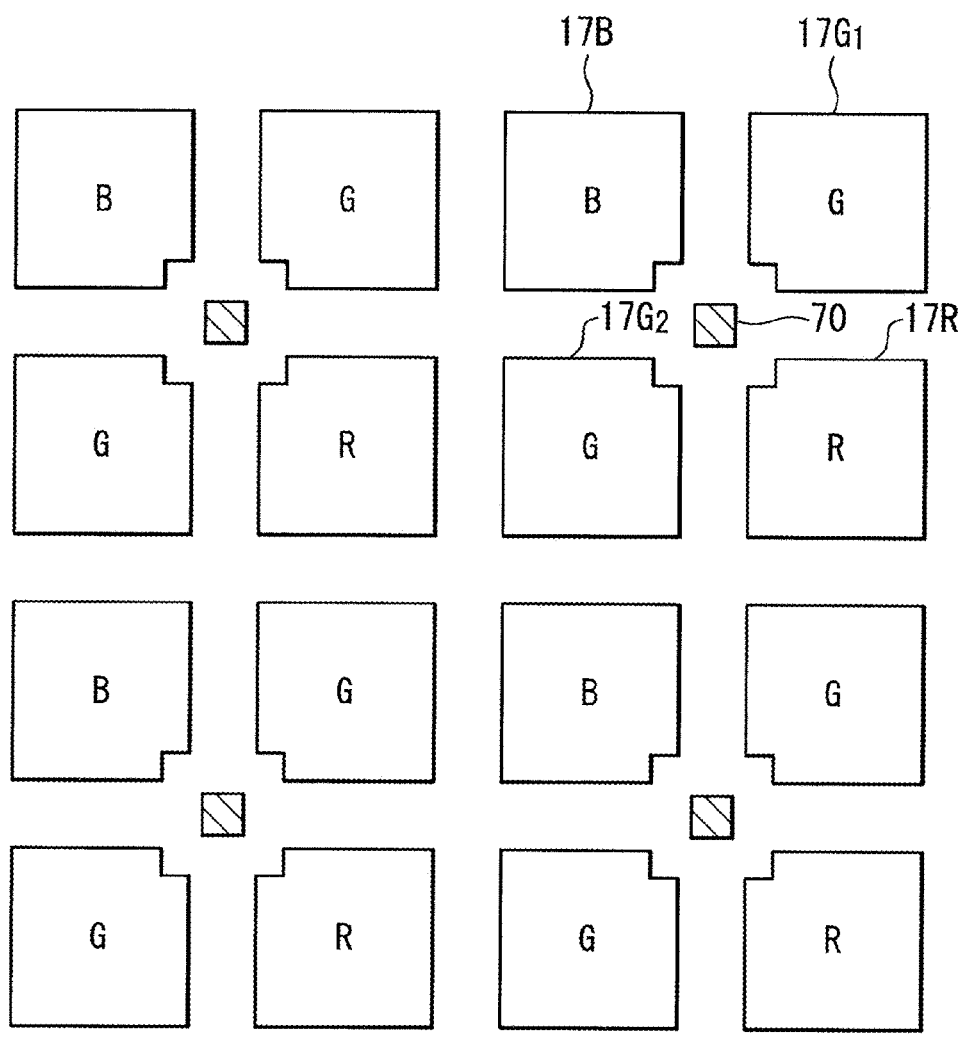
FIG. 14 is a schematic planer configuration diagram of a pixel part of the solid-state imaging device according to another embodiment of the invention.

For example, in FIG. 14, it is configured such that the contact parts 70 are arranged between the first conductivity-type impurity regions 17 on the assumption that the contacts are dropped down to the p-well, etc. from the rear surface side, and an example of a planner shape is shown in which parts of the first conductivity-type impurity regions 17 are omitted. When such a planer shape is taken, the positions of the gravities are not at even intervals in a precise sense. However, even when such configuration is taken, there would be no problem if the configuration is in such a level that sampling can be treated as being carried out at even intervals in subsequent signal processing.

Figure 15:
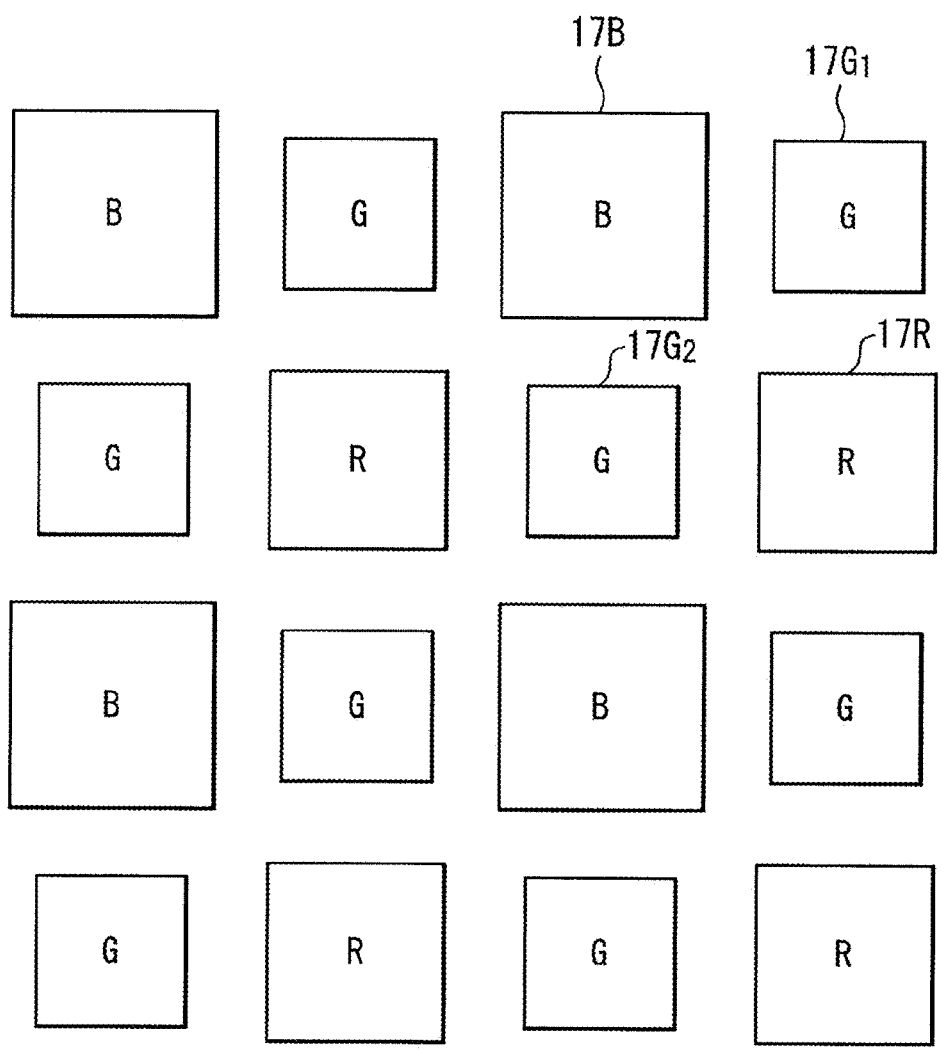
FIG. 15 is a schematic planer configuration diagram of a pixel part of the solid-state imaging device according to another embodiment of the invention.

Also, for example, to align the spectral sensitivities, it is also possible as illustrated in FIG. 15 to differentiate the areas of the first conductivity-type impurity regions 17 as the rear surface side regions correspondingly to the positions of the color filters. In the example illustrated in FIG. 15, although respective areas of the first conductivity-type impurity regions 17 are different, positions of their gravities are lined up at even intervals.

For example, when blue sensitivity is hard to be obtained, as illustrated in FIG. 15, only the light reception units 61 corresponding to blue color filters, in this example, the first conductivity-type impurity regions 17B, are made with their areas increased, and thereby the blue sensitivity can be increased.

Figure 16:
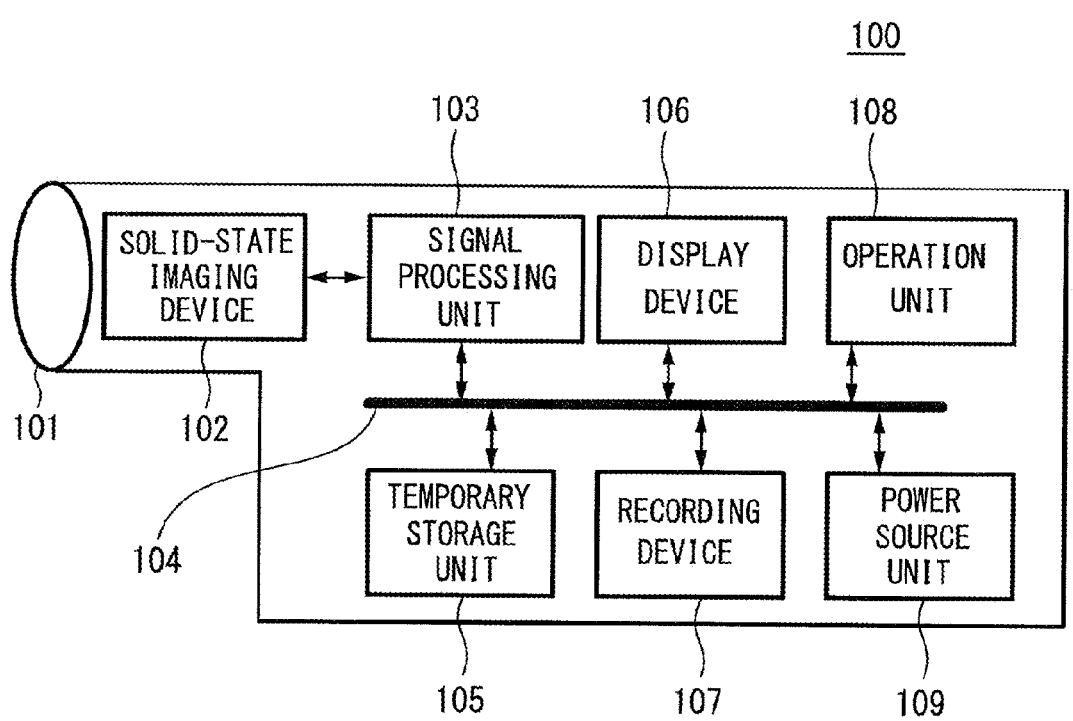
FIG. 16 is a schematic configuration diagram of an imaging apparatus according to an embodiment of the invention.

Using the above-described solid-state imaging device according to an embodiment of the present invention, as illustrated in FIG. 16, it is possible to make an imaging apparatus 100 according to an embodiment of the invention.

The imaging apparatus 100 illustrated in FIG. 16 is configured as an electronic apparatus having the functions of a portable phone, a digital still camera, and a video camera, and other imaging functions. The imaging apparatus 100 includes an imaging optical unit 101, a solid-state imaging device 102, a signal processing unit 103, and a temporary storage unit 105, a display device 106, a recording device 107, an operation unit 108, and a power source unit 109, which are connected with the signal processing unit 103 by a transmission bus line 104.

The imaging optical unit 101 includes various lenses, a shutter, a diaphragm, etc., and guides light of an imaging subject to the solid-state imaging device 102. The solid-state imaging device 102 is the solid-state imaging device according to the above-described embodiment of the invention, and photo-electrically converts the light from the imaging subject imaged through the imaging optical unit 101 to be outputted as a signal. The signal processing unit 103 includes a DSP (Digital Signal processor) for processing digital signals, etc., and carries out formatting processing, etc. on image signals outputted from the solid-state imaging device 102 to be converted to data for displaying and recording.

The temporary storage unit 105 includes a RAM (Random Access Memory), etc., and temporarily stores image data processed by the signal processing unit 103. The display device 106 includes a liquid crystal display, etc., and displays the image data processed by the signal processing unit 103. The recording device 107 includes a flash memory, an EPROM (Erasable Programmable ROM), an HD (hard disk), etc., and records image data. The operation unit 108 includes a shutter button for inputting a control signal controlling the operation of the imaging apparatus 100 from outside, various function keys, a cursor, etc. The power source unit 109 supplies the operation power to the above-described units of the imaging apparatus 100.

By configuring the imaging apparatus 100 using the solid-state imaging device according to the above-described embodiment, it is possible to carry out signal processing with sampling at even intervals, so that it becomes possible to avoid signal processing from becoming complicated.

It should be noted that the configuration of the imaging apparatus 100 is not limited to the above-described one, and various other configurations may be adopted.

As described above, according to the solid-state imaging device and the imaging apparatus of the invention, with the provision of a common pixel circuit for a plurality of pixels, while increasing the number of pixels as the pixels are miniaturized, by arranging the rear surface side regions of the light reception units at approximately even intervals as the rear-surface-incident-type device, the incident light can be sampled at even intervals.

Further, the range of choices of the signal processing unit, for example, a DSP, is expanded, and shading correction and other signal processing are avoided from becoming complicated. As a result, the signal processing becomes light, and images become clean. Further, because of sampling at even intervals, the characteristics of pixels are not decreased, and relatively clean images can be imaged.

As described above, even if PDs are arranged at uneven intervals because of the layout of pixel sharing, the incident light can be sampled at even intervals.

Thereby, in contrast to the known solid-state imaging devices in which PDs are arranged at uneven intervals, the following advantages can be obtained.

a) Signal processing is simple and concise, and as a result, a relatively clean image can be provided.

b) It is not necessary to design the signal processing unit, for example, a DSP system, for each product of CMOS sensors, and it is not necessary to differentiate the system of the signal processing unit based on the arrangement of pixels.

c) Reproducibility of intervals of stripes and coloring manner when stripe patterns have been imaged is satisfactory.

d) Because many choices are available for signal processing ICs, the apparatus configuring method is diversified.

e) How shading comes out does not change due to uneven intervals of the incident light reception units. For example, when a white subject is imaged, it does not occur that the upper edge and the lower edge are colored and moreover colored in different colors such that correction becomes difficult, and it is avoided that signal processing becomes complicated.

Also, in the known solid-state imagine device, with respect to the method of solving the inconveniences caused by that pixel circuits are shared and that the light reception units are arranged at uneven intervals, when the invention is applied, the following effects are produced.

f) It is not necessary to put a limitation to the shape of the opening and it can be avoided that the area of the light reception unit is decreased.

g) It can be avoided that the characteristics of the pixel circuit such as conversion gain, etc. is cause to decrease.

h) Because the area of the light reception unit can be kept as compared with the front-surface-incident-type device, lowering of the sensitivity can be avoided.

i) Although each time when newly designing a solid-state imaging device such as a CMOS sensor, etc. for a different pixel size, works were necessary such as reselecting materials different in refractive index and redesigning the shape of an in-layer lens, such complicated works become unnecessary.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
a semiconductor substrate having a first side and a second side, opposite the first side, as a light incident side;
a plurality of transistors disposed at the first side of the semiconductor substrate;
first and second neighboring photoelectric conversion regions disposed in the semiconductor substrate; wherein:
the first and second photoelectric conversion regions share at least one first shared transistor from the plurality of transistors;
each of the first and second photoelectric conversion regions comprises a respective impurity region adapted to produce charge in response to incident light;
the plurality of transistors comprises first and second transfer transistors coupled to the first and second photoelectric conversion regions, respectively, the first and second transfer transistors being positioned to allow charge produced by the impurity regions of the respective first and second photoelectric conversion regions to be selectively transferred to a first floating diffusion shared by the first and second photoelectric conversion regions; and
the impurity regions of the first and second photoelectric conversion regions are greater than or equal to one micrometer thick and less than or equal to five micrometers thick in a depth direction between the first and second sides of the semiconductor substrate.

2. The imaging device of claim 1, wherein:
portions of the impurity regions of the first and second photoelectric conversion regions parallel to and adjacent the second side of the semiconductor substrate each have a substantially square shape with at least one cutout portion.

3. The imaging device of claim 1, wherein:
each of the first and second photoelectric conversion regions comprises a respective first impurity region of a first conductivity type adjacent the first side of the semiconductor substrate and a second impurity region of a second conductivity type adapted to produce charge in response to incident light; and
for each of the first and second photoelectric conversion regions, the second impurity region is thicker than the first impurity region in the depth direction between the first and second sides of the semiconductor substrate.

4. The imaging device of claim 1, wherein the first and second photoelectric conversion regions are non-overlapping in the depth direction between the first and second sides of the semiconductor substrate.

5. The imaging device of claim 1, wherein each of the plurality of transistors comprises a source region and a drain region in the semiconductor substrate, a gate electrode between the source region and the drain region, and an insulting layer between the gate electrode and the semiconductor substrate.

6. The imaging device of claim 1, wherein:
the first and second photoelectric conversion regions are arranged in a first row;
the at least one first shared transistor comprises a first reset transistor positioned to allow charge to be selectively discharged from the first floating diffusion to a circuit node, and a first amplification transistor positioned to allow a signal corresponding to a potential of the first floating diffusion to be output to a signal line; and the first reset transistor and the first amplification transistor are arranged in a second row parallel to and adjacent the first row.

7. The imaging device of claim 1, wherein shapes of the first and second photoelectric conversion regions along a cross-section in the depth direction between the first and second sides of the semiconductor substrate are different.

8. The imaging device of claim 1, wherein:
each of the first and second photoelectric conversion regions has a respective region in a plane parallel to and adjacent the second side; and
areas of the regions of the first and second photoelectric conversion regions are substantially the same.

9. The imaging device of claim 1, wherein:
each of the first and second photoelectric conversion regions comprises a respective first impurity region positioned adjacent the first side of the semiconductor substrate and a respective second impurity region positioned adjacent the second side of the semiconductor substrate; and
an impurity density in the first impurity region of each photoelectric conversion region is greater than an impurity density in the second impurity region of that photoelectric conversion region.

10. The imaging device of claim 1, wherein the at least one first shared transistor comprises a first reset transistor positioned to allow charge to be selectively discharged from the first floating diffusion to a circuit node.

11. The imaging device of claim 1, wherein:
the imaging device further comprises an isolation region disposed between the impurity regions of the first and second photoelectric conversion regions; and
for each of the first and second photoelectric conversion regions, the impurity region is thicker than the isolation region in the depth direction between the first and second sides of the semiconductor substrate.

12. The imaging device of claim 11, wherein the isolation region comprises a shallow trench isolation region.

13. The imaging device of claim 1, further comprising:
at least one wiring layer disposed above the first side and the plurality of transistors such that the at least one wiring layer is on a side of the semiconductor substrate opposite the light-incident side.

14. The imaging device of claim 13, further comprising a support layer disposed above the at least one wiring layer such that the at least one wiring layer is between the support layer and the first side.

15. The imaging device of claim 1, wherein the at least one first shared transistor comprises a first amplification transistor coupled to the first floating diffusion so as to allow a signal corresponding to a potential of the first floating diffusion to be output to a signal line.

16. The imaging device of claim 15, wherein the at least one first shared transistor further comprises a first select transistor positioned to selectively enable operation of the amplification transistor.

17. The imaging device of claim 1, further comprising:
first and second on-chip lenses corresponding to the first and second photoelectric conversion regions, respectively, and disposed adjacent the second side of the semiconductor substrate.

18. The imaging device of claim 17, further comprising:
first and second color filters disposed between the first and second on-chip lenses, respectively, and the second side of the semiconductor substrate.

19. The imaging device of claim 18, further comprising:
an oxide film disposed between the first and second color filters and the second side of the semiconductor substrate.

20. The imaging device of claim 19, further comprising:
a silicon nitride film disposed between the oxide film and the first and second color filters.

21. The imaging device of claim 1, wherein the at least one first shared transistor comprises:
a first reset transistor positioned to allow charge to be selectively discharged from the first floating diffusion to a circuit node;
a first amplification transistor coupled to the first floating diffusion so as to allow a signal corresponding to a potential of the first floating diffusion to be output to a signal line; and
a first select transistor positioned to selectively enable operation of the amplification transistor.

22. The imaging device of claim 21, wherein:
the first and second photoelectric conversion regions are arranged in a first row; and
the first reset transistor, the first amplification transistor, and the first select transistor are disposed in a second row parallel to and adjacent the first row.

23. The imaging device of claim 22, wherein:
the first amplification transistor is disposed between the first reset transistor and the first select transistor in the second row.

24. The imaging device of claim 21, further comprising:
a vertical drive circuit;
a column circuit coupled to the signal line and configured to perform correlated double sampling of the signal, convert the signal to a digital signal, and provide the digital signal to a horizontal bus; and
an output circuit coupled to the horizontal bus and configured to receive and process the digital signal therefrom.

25. The imaging device of claim 24, wherein the output circuit is configured to perform at least one of black level adjustment processing to adjust the digital signal or correction processing to correct the digital signal.

26. The imaging device of claim 24, further comprising a memory configured to store a processed digital signal received from the output circuit.

27. An imaging device, comprising:
a semiconductor substrate having a first side and a second side, opposite the first side, as a light incident side;
a plurality of transistors disposed at the first side of the semiconductor substrate;
first and second neighboring photoelectric conversion regions disposed in the semiconductor substrate; and
third and fourth light neighboring photoelectric conversion regions disposed in the semiconductor substrate;
wherein:
the first, second, third and fourth photoelectric conversion regions share at least one first shared transistor from the plurality of transistors;
the plurality of transistors comprises first, second, third and fourth transfer transistors associated with the first, second, third and fourth photoelectric conversion regions, respectively, the first, second, third and fourth transfer transistors coupled to a first floating diffusion shared by the first, second, third and fourth photoelectric conversion regions;
the first and second photoelectric conversion regions are arranged in a first row;

the third and fourth photoelectric conversion regions are arranged in a second row parallel to and adjacent the first row;

the first floating diffusion is disposed between the first and second rows so as to be surrounded by the first, second, third, and fourth photoelectric conversion regions;

the at least one first shared transistor comprises a first amplification transistor coupled to the first floating diffusion so as to allow a signal corresponding to a potential of the first floating diffusion to be output to a signal line;

the imaging device further comprises a fifth photoelectric conversion region disposed in the semiconductor substrate and neighboring the first photoelectric conversion region; and a portion of the first amplification transistor is located between the first and fifth photoelectric conversion regions.

28. The imaging device of claim 27, wherein:

portions of the impurity regions of the first, second, third and fourth photoelectric conversion regions parallel to and adjacent the second side of the semiconductor substrate each have a substantially square shape with at least one cutout portion.

29. The imaging device of claim 27, wherein:

each of the first, second, third and fourth photoelectric conversion regions comprises a respective first impurity region of a first conductivity type adjacent the first side of the semiconductor substrate and a second impurity region of a second conductivity type adapted to produce charge in response to incident light; and for each of the first, second, third and fourth photoelectric conversion regions, the second impurity region is thicker than the first impurity region in a depth direction between the first and second sides of the semiconductor substrate.

30. The imaging device of claim 27, wherein the first, second, third and fourth photoelectric conversion regions are non-overlapping in a depth direction between the first and second sides of the semiconductor substrate.

31. The imaging device of claim 27, wherein each of the plurality of transistors comprises a source region and a drain region in the semiconductor substrate, a gate electrode between the source region and the drain region, and an insulting layer between the gate electrode and the semiconductor substrate.

32. The imaging device of claim 27, wherein:

each of the first, second, third and fourth photoelectric conversion regions has a respective region in a plane parallel to and adjacent the second side; and areas of the regions of the first, second, third and fourth photoelectric conversion regions are substantially the same.

33. The imaging device of claim 27, wherein:

each of the first, second, third and fourth photoelectric conversion regions comprises a respective first impurity region positioned adjacent the first side of the semiconductor substrate and a respective second impurity region positioned adjacent the second side of the semiconductor substrate; and an impurity density in the first impurity region of each photoelectric conversion region is greater than an impurity density in the second impurity region of that photoelectric conversion region.

34. The imaging device of claim 27, wherein the at least one first shared transistor further comprises a first reset transistor positioned to allow charge to be selectively discharged from the first floating diffusion to a circuit node.

35. The imaging device of claim 27, wherein the at least one first shared transistor further comprises a first select transistor positioned to selectively enable operation of the amplification transistor.

36. The imaging device of claim 27, wherein:

the imaging device further comprises an isolation region disposed between the impurity regions of the first and second photoelectric conversion regions; and for each of the first and second photoelectric conversion regions, the impurity region is thicker than the isolation region in a depth direction between the first and second sides of the semiconductor substrate.

37. The imaging device of claim 36, wherein the isolation region comprises a shallow trench isolation region.

38. The imaging device of claim 27, further comprising:

at least one wiring layer disposed above the first side and the plurality of transistors such that the at least one wiring layer is on a side of the semiconductor substrate opposite the light-incident side.

39. The imaging device of claim 38, further comprising a support layer disposed above the at least one wiring layer such that the at least one wiring layer is between the support layer and the first side.

40. The imaging device of claim 27, wherein:

the at least one first shared transistor further comprises a first reset transistor positioned to allow charge to be selectively discharged from the first floating diffusion to a circuit node; and the first reset transistor and the first amplification transistor are arranged in a third row parallel to and adjacent at least one of the first row or the second row.

41. The imaging device of claim 40, wherein shapes of the first and second photoelectric conversion regions along a cross-section in a depth direction between the first and second sides of the semiconductor substrate are different, and shapes of the third and fourth photoelectric conversion regions along a cross-section in the depth direction between the first and second sides of the semiconductor substrate are different.

42. The imaging device of claim 27, wherein:

shapes of the first and second photoelectric conversion regions along a cross-section in a depth direction between the first and second sides of the semiconductor substrate are different.

43. The imaging device of claim 42, wherein:

shapes of the third and fourth photoelectric conversion regions along a cross-section in the depth direction between the first and second sides of the semiconductor substrate are different.

44. The imaging device of claim 27, wherein the at least one first shared transistor further comprises:

a first reset transistor positioned to allow charge to be selectively discharged from the first floating diffusion to a circuit node; and a first select transistor positioned to selectively enable operation of the amplification transistor.

45. The imaging device of claim 44, wherein the first reset transistor, the first amplification transistor, and the first select transistor are disposed in a third row parallel to and adjacent the second row.

46. The imaging device of claim 45, wherein the first amplification transistor is disposed between the first reset transistor and the first select transistor in the third row.

47. The imaging device of claim 27, further comprising:
a vertical drive circuit;
a column circuit coupled to the signal line and configured to perform correlated double sampling of the signal, convert the signal to a digital signal, and provide the digital signal to a horizontal bus; and
an output circuit coupled to the horizontal bus and configured to receive and process the digital signal therefrom.

48. The imaging device of claim 47, wherein the output circuit is configured to perform at least one of black level adjustment processing to adjust the digital signal or correction processing to correct the digital signal.

49. The imaging device of claim 47, further comprising a memory configured to store a processed digital signal received from the output circuit.

50. The imaging device of claim 27, further comprising:
first, second, third and fourth on-chip lenses corresponding to the first, second, third and fourth photoelectric conversion regions, respectively, and disposed adjacent the second side of the semiconductor substrate.

51. The imaging device of claim 50, further comprising:
first, second, third and fourth color filters disposed between the first, second, third and fourth on-chip lenses, respectively, and the second side of the semiconductor substrate.

52. The imaging device of claim 51, further comprising:
an oxide film disposed between the first, second, third and fourth color filters and the second side of the semiconductor substrate.

53. The imaging device of claim 52, further comprising:
a silicon nitride film disposed between the oxide film and the first, second, third and fourth color filters.

54. An imaging device, comprising:
a semiconductor substrate having a first side and a second side, opposite the first side, as a light incident side;
a plurality of transistors disposed at the first side of the semiconductor substrate;
first and second neighboring photoelectric conversion regions disposed in the semiconductor substrate;
third and fourth light neighboring photoelectric conversion regions disposed in the semiconductor substrate;
wherein:
the first, second, third and fourth photoelectric conversion regions share at least one first shared transistor from the plurality of transistors;
the plurality of transistors comprises first, second, third and fourth transfer transistors associated with the first, second, third and fourth photoelectric conversion regions, respectively, the first, second, third and fourth transfer transistors coupled to a first floating diffusion shared by the first, second, third and fourth photoelectric conversion regions;
the first and second photoelectric conversion regions are arranged in a first row;
the third and fourth photoelectric conversion regions are arranged in a second row parallel to and adjacent the first row;
the first floating diffusion is disposed between the first and second rows so as to be surrounded by the first, second, third, and fourth photoelectric conversion regions;
the at least one first shared transistor comprises:
a first reset transistor positioned to allow charge to be selectively discharged from the first floating diffusion to a circuit node;
a first amplification transistor coupled to the first floating diffusion so as to allow a signal corresponding to a potential of the first floating diffusion to be output to a signal line; and
a first select transistor positioned to selectively enable operation of the first amplification transistor; and
the first reset transistor, the first amplification transistor, and the first select transistor are disposed in a third row parallel to and adjacent the second row;
fifth and sixth neighboring photoelectric conversion regions disposed in the semiconductor substrate; and
seventh and eighth neighboring photoelectric conversion regions disposed in the semiconductor substrate;
wherein:
the plurality of transistors further comprises fifth, sixth, seventh and eighth transfer transistors associated with the fifth, sixth, seventh and eighth photoelectric conversion regions, respectively, the fifth, sixth, seventh and eighth transfer transistors coupled to a second floating diffusion shared by the fifth, sixth, seventh and eighth photoelectric conversion regions;
the fifth and sixth photoelectric conversion regions are arranged in a fourth row parallel to and adjacent the third row;
the seventh and eighth photoelectric conversion regions are arranged in a fifth row parallel to and adjacent the fourth row;
the second floating diffusion is disposed between the fourth and fifth rows so as to be surrounded by the fifth, sixth, seventh and eighth photoelectric conversion regions; and
the fifth, sixth, seventh and eighth photoelectric conversion regions share at least one second shared transistor from the plurality of transistors.

55. The imaging device of claim 54, wherein the at least one second shared transistor comprises:
a second reset transistor positioned to allow charge to be selectively discharged from the second floating diffusion to a circuit node;
a second amplification transistor coupled to the second floating diffusion so as to allow a signal corresponding to a potential of the second floating diffusion to be output to a signal line; and
a second select transistor positioned to selectively enable operation of the second amplification transistor; and
wherein:
the second reset transistor, the second amplification transistor, and the second select transistor are disposed in a sixth row parallel to and adjacent the fifth row.

56. The imaging device of claim 54, wherein:
portions of the impurity regions of the first, second, third, fourth, fifth, sixth, seventh and eighth photoelectric conversion regions parallel to and adjacent the second side of the semiconductor substrate each have a substantially square shape with at least one cutout portion.

57. The imaging device of claim 54, wherein:
each of the first, second, third, fourth, fifth, sixth, seventh and eighth reception units comprises a respective first impurity region of a first conductivity type adjacent the first side of the semiconductor substrate and a second impurity region of a second conductivity type adapted to produce charge in response to incident light; and
for each of the first, second, third, fourth, fifth, sixth, seventh and eighth photoelectric conversion regions, the second impurity region is thicker than the first impurity region in a depth direction between the first and second sides of the semiconductor substrate.

58. The imaging device of claim 54, wherein the first, second, third, fourth, fifth, sixth, seventh and eighth photoelectric conversion regions are non-overlapping in the depth direction between the first and second sides of the semiconductor substrate.

59. The imaging device of claim 54, wherein each of the plurality of transistors comprises a source region and a drain region in the semiconductor substrate, a gate electrode between the source region and the drain region, and an insulting layer between the gate electrode and the semiconductor substrate.

60. The imaging device of claim 54, wherein:
shapes of the first and second photoelectric conversion regions along a cross-section in a depth direction between the first and second sides of the semiconductor substrate are different,
shapes of the third and fourth photoelectric conversion regions along a cross-section in the depth direction between the first and second sides of the semiconductor substrate are different,
shapes of the fifth and sixth photoelectric conversion regions along a cross-section in the depth direction between the first and second sides of the semiconductor substrate are different, and
shapes of the seventh and eighth photoelectric conversion regions along a cross-section in the depth direction between the first and second sides of the semiconductor substrate are different.

61. The imaging device of claim 54, wherein:
each of the first, second, third, fourth, fifth, sixth, seventh and eighth photoelectric conversion regions has a respective region in a plane parallel to and adjacent the second side; and
areas of the regions of the first, second, third, fourth, fifth, sixth, seventh and eighth photoelectric conversion regions are substantially the same.

62. The imaging device of claim 54, wherein:
each of the first, second, third, fourth, fifth, sixth, seventh and eighth photoelectric conversion regions comprises a respective first impurity region positioned adjacent the first side of the semiconductor substrate and a respective second impurity region positioned adjacent the second side of the semiconductor substrate; and
an impurity density in the first impurity region of each photoelectric conversion region is greater than an impurity density in the second impurity region of that photoelectric conversion region.

63. The imaging device of claim 54, wherein:
the first amplification transistor is disposed between the first reset transistor and the first select transistor in the third row.

64. The imaging device of claim 54, wherein:
the imaging device further comprises an isolation region disposed between the impurity regions of the first and second photoelectric conversion regions; and
for each of the first and second photoelectric conversion regions, the impurity region is thicker than the isolation region in a depth direction between the first and second sides of the semiconductor substrate.

65. The imaging device of claim 64, wherein the isolation region comprises a shallow trench isolation region.

66. The imaging device of claim 54, further comprising:
at least one wiring layer disposed above the first side and the plurality of transistors such that the at least one wiring layer is on a side of the semiconductor substrate opposite the light-incident side.

67. The imaging device of claim 66, further comprising a support layer disposed above the at least one wiring layer such that the at least one wiring layer is between the support layer and the first side.

68. The imaging device of claim 54, wherein:
shapes of the first and second photoelectric conversion regions along a cross-section in a depth direction between the first and second sides of the semiconductor substrate are different.

69. The imaging device of claim 68, wherein:
shapes of the third and fourth photoelectric conversion regions along a cross-section in a depth direction between the first and second sides of the semiconductor substrate are different.

70. The imaging device of claim 54, further comprising:
a vertical drive circuit;
a column circuit coupled to the signal line and configured to perform correlated double sampling of the signal, convert the signal to a digital signal, and provide the digital signal to a horizontal bus; and
an output circuit coupled to the horizontal bus and configured to receive and process the digital signal therefrom.

71. The imaging device of claim 70, wherein the output circuit is configured to perform at least one of black level adjustment processing to adjust the digital signal or correction processing to correct the digital signal.

72. The imaging device of claim 70, further comprising a memory configured to store a processed digital signal received from the output circuit.

73. The imaging device of claim 54, further comprising:
first, second, third, fourth, fifth, sixth, seventh and eighth on-chip lenses corresponding to the first, second, third, fourth, fifth, sixth, seventh and eighth photoelectric conversion regions, respectively, and disposed adjacent the second side of the semiconductor substrate.

74. The imaging device of claim 73, further comprising:
first, second, third, fourth, fifth, sixth, seventh and eighth color filters disposed between the first, second, third, fourth, fifth, sixth, seventh and eighth on-chip lenses, respectively, and the second side of the semiconductor substrate.

75. The imaging device of claim 74, further comprising:
an oxide film disposed between the first, second, third, fourth, fifth, sixth, seventh and eighth color filters and the second side of the semiconductor substrate.

76. The imaging device of claim 75, further comprising:
a silicon nitride film disposed between the oxide film and the first, second, third, fourth, fifth, sixth, seventh and eighth color filters.

* * * * *